(12) United States Patent
Yoshida et al.

(10) Patent No.: US 8,618,889 B2
(45) Date of Patent: Dec. 31, 2013

(54) OSCILLATION DRIVE DEVICE, PHYSICAL QUANTITY MEASUREMENT DEVICE AND ELECTRONIC APPARATUS

(75) Inventors: Naoki Yoshida, Suwa (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 994 days.

(21) Appl. No.: 12/704,785

(22) Filed: Feb. 12, 2010

(65) Prior Publication Data
US 2010/0206074 A1 Aug. 19, 2010

(30) Foreign Application Priority Data
Feb. 19, 2009 (JP) ................................. 2009-036250

(51) Int. Cl.
*H03B 5/32* (2006.01)

(52) U.S. Cl.
USPC ............... 331/158; 331/116 R; 331/116 FE; 331/160; 331/182; 331/183

(58) Field of Classification Search
USPC ........... 331/109, 116 R, 116 FE, 116 M, 158, 331/159, 160, 172, 173, 182, 183; 310/316.01, 329; 73/488, 514.01, 73/514.34, 579
See application file for complete search history.

(56) References Cited

U.S. PATENT DOCUMENTS

| 7,009,460 | B2 * | 3/2006 | Wilcox | .......................... 331/173 |
| 7,089,793 | B2 | 8/2006 | Yokoi et al. | |
| 2008/0087084 | A1 * | 4/2008 | Kanai et al. | ................ 73/514.29 |
| 2008/0105054 | A1 * | 5/2008 | Kanai et al. | ................ 73/514.29 |

FOREIGN PATENT DOCUMENTS

| JP | A-2004-286503 | 10/2004 |
| JP | A-2008-139287 | 6/2008 |

* cited by examiner

*Primary Examiner* — Joseph Chang
*Assistant Examiner* — Jeffrey Shin
(74) *Attorney, Agent, or Firm* — Oliff & Berridge, PLC

(57) ABSTRACT

There is provided an oscillation drive device that forms an oscillation loop with a vibrator for exciting a driving vibration on the vibrator. The oscillation drive device includes: a comparator that excites a driving vibration on the vibrator based on a signal in the oscillation loop with a given voltage as a reference; an oscillation detector that detects oscillation in the oscillation loop; a signal generation circuit that generates a switching control signal based on an oscillation result given by the oscillation detector; and a switch circuit inserted between the vibrator in the oscillation loop and an output of the comparator, wherein, during an oscillation startup stage in which oscillation in the oscillation loop is not detected by the oscillation detector, the switch circuit alternately switches, based on the switching control signal, between a period in which the output of the comparator and the vibrator are electrically connected and a period in which a predetermined set voltage is supplied to the vibrator.

14 Claims, 15 Drawing Sheets

OSCILLATION DRIVE DEVICE, PHYSICAL QUANTITY MEASUREMENT DEVICE AND ELECTRONIC APPARATUS

The entire disclosure of Japanese Patent Application No. 2009-036250, filed Feb. 2, 2009 is expressly incorporated by reference herein.

BACKGROUND

1. Technical Field

The present invention relates to oscillation drive devices, physical quantity measurement devices and electronic apparatuses.

2. Related Art

So-called gyroscopes are classified into various types including a rotation type and a vibration type depending on the method of detecting the force acting on an object. Above all, the vibration type gyroscopes are considered to be advantageous for size-reduction and cost-reduction from the viewpoint of their components. Among such vibration type gyroscopes, vibration type gyro-sensors that detect angular velocity acting on an object are known. The vibration type gyro-sensors include a piezoelectric vibration type gyro-sensor that excites a crystal element or a piezoelectric element that is reliable and advantageous in size-reduction. The piezoelectric vibration type gyro-sensor uses a phenomenon in which, when an angular velocity occurs with respect to an object that is vibrating, a Coriolis force is generated in a direction perpendicular to the vibration.

Vibration type gyro-sensors have wide applications, and may be used for, for example, detection of vibration of video cameras, digital cameras and the like, position detection by a global positioning system (GPS) for car navigation systems, posture detection for aircrafts, robots and the like.

In the applications described above, a vibration type gyro-sensor may be operated by a battery. Accordingly, the power consumption of the vibration type gyro-sensor needs to be reduced as much as possible such that the operating life of the battery is to be extended. In this case, it is preferable to stop power supply to the vibration type gyro-sensor while an angular velocity or the like is not detected, and to allow power supply from the battery only when the vibration type gyro-sensor is used. Therefore, after starting the vibration type gyro-sensor, it is necessary to establish its normal operation within a short period of time.

A technology to shorten the startup time of such a vibration type gyro-sensor is described in, for example, Japanese Laid-open Patent Application 2004-286503 (Patent Document 1). Patent Document 1 describes a technology to increase the oscillation amplitude by an amplifier even immediately after activating the sensor, using a structure in which a CR oscillation circuit or a ring oscillator is added within an oscillation loop.

It is noted that, in order to stably detect angular velocities acting on a vibrator, a driver device for the vibration type gyro-sensor needs to vibrate (oscillate) the vibrator stably at a resonance frequency. Also, the vibrator needs to start oscillation and establish its normal operation in a short period of time. Furthermore, the driver device is preferably formed from a small-sized circuit with a low power consumption in order to lower the cost and extend the operating life of the battery.

On the other hand, if the vibrator is made of a crystal with a high Q value and the vibrator is vacuum-sealed inside a package, the driving Q value of the vibrator becomes very high. This causes a problem in that, when the vibrator is excited to generate a driving vibration, it needs a longer time (startup time) for a signal from the vibrator to stabilize.

However, according to the technology provided in Patent Document 1, if the vibrator is to be oscillated with a frequency that is close to the driving frequency of the crystal oscillator, the element area of capacitors and resistances of the CR oscillation circuit becomes large. This brings about a problem which results in a bulkier vibration type gyroscope (vibration type gyro-sensor) and a higher cost. Also, according to the technology provided in Patent Document 1, the vibrator is started initially with a different frequency, and thus is difficult to be brought into a driving frequency of the crystal oscillator with a high Q value. Therefore, if the vibrator is affected by a manufacturing variation or the like, another problem may be caused in that it takes a longer time to establish stable oscillation Moreover, according to the technology described in Patent Document 1, regardless of whether or not the vibrator is oscillating, energy of the signal from the CR oscillation circuit is injected in the vibrator. In this case, the energy with a predetermined fixed frequency is applied regardless of the resonance frequency of the vibrator, such that the signal of the CR oscillation circuit would become hindrance to the stationary oscillation of the vibrator as the vibrator approaches to its stationary oscillation. Accordingly, in order to shorten the startup time up to the stationary oscillation of the vibrator, the energy needs to be injected into the oscillation loop in a manner not to be substantially apart from the stationary oscillation condition of the oscillation loop including the vibrator to the extent to cause hindrance to oscillation of the vibrator.

Furthermore, if excitation of the driving vibration of the vibrator is performed simply by a comparator, and the energy of the signal from the CR oscillator circuit is injected at the input side of the comparator, the comparator generates an output signal with high frequency components. This causes a problem in that the timing of the energy given by an equivalent circuit constant of the vibrator would become substantially shifted away from the stationary oscillation condition, which may cause a startup failure.

SUMMARY

In accordance with some embodiments of the invention, it is possible to provide an oscillation drive device that can reliably oscillate, and shorten its oscillation startup time, and to provide a physical quantity measurement device and an electronic apparatus using the oscillation drive device.

(1) An embodiment of the invention pertains to an oscillation drive device that forms an oscillation loop with a vibrator for exciting a driving vibration on the vibrator, wherein the oscillation drive device includes: a comparator that excites a driving vibration on the vibrator based on a signal in the oscillation loop with a given voltage as a reference; an oscillation detector that detects oscillation in the oscillation loop; a signal generation circuit that generates a switching control signal based on an oscillation result given by the oscillation detector; and a switch circuit inserted between the vibrator in the oscillation loop and an output of the comparator. In one aspect of the invention, during an oscillation startup stage in which oscillation in the oscillation loop is not detected by the oscillation detector, the switch circuit alternately switches, based on the switching control signal, between a period in which the output of the comparator and the vibrator are electrically connected and a period in which a predetermined set voltage is supplied to the vibrator.

According to the embodiment described above, energy is injected into the vibrator at the output side of the comparator by the function of the comparator and the switch circuit at the time of oscillation startup, and the energy is supplied only to the vibrator without being supplied to another analog circuit in the oscillation loop, such that oscillation of the vibrator can be reliably started. Furthermore, since the aforementioned energy is a noise component for the other analog circuit, the structure according to the present embodiment can suppress malfunction of the analog circuit and wasteful power consumption.

(2) In accordance with an aspect of the embodiment of the invention, the switch circuit may electrically connect the output of the comparator with the vibrator based on the switching control signal in a stationary oscillation state in which oscillation in the oscillation loop is detected by the oscillation detector.

According to the embodiment described above, in addition to the effect described above, the output of the comparator is continuously connected with the vibrator in the stationary oscillation state, whereby the stationary oscillation state can be continued with a simple structure.

(3) In accordance with another aspect of the embodiment of the invention, the set voltage may be a voltage between a high potential side voltage of the comparator and a low potential side voltage of the comparator.

According to the embodiment described above, even in the case where the output of the comparator could be fixed to the side of the high potential side voltage or to the side of the low potential side voltage because the amplitude of a signal in the oscillation loop is small at the time of oscillation startup, the output of the comparator will not be fixed at the time of oscillation startup, regardless of variations in the temperature condition, the power supply condition and the process condition, and oscillation of the vibrator can be reliably started.

(4) Another aspect of the embodiment of the invention pertains to an oscillation drive device that forms an oscillation loop with a vibrator for exciting a driving vibration in the vibrator, wherein the oscillation drive device includes: a comparator that excites a driving vibration on the vibrator based on a signal in the oscillation loop with a given voltage as a reference; a synchronous wave detection comparator that generates a reference signal for synchronous detection based on a signal in the oscillation loop; an oscillation detector that detects oscillation in the oscillation loop; a signal generation circuit that generates a switching control signal based on an oscillation result given by the oscillation detector; a first switch circuit inserted between the vibrator in the oscillation loop and an output of the comparator; and a second switch circuit inserted between an output of the synchronous wave detection comparator and the vibrator. During an oscillation startup stage in which oscillation in the oscillation loop is not detected by the oscillation detector, the first switch circuit electrically shuts off the output of the comparator from the vibrator based on the switching control signal, and the second switch alternately switches based on the switching control signal between a period in which an output of the synchronous wave detection comparator and the vibrator are electrically connected and a period in which a predetermined set voltage is supplied to the vibrator.

According to the embodiment described above, for measuring a physical quantity using an output signal obtained by synchronous wave detection of a detected signal that is outputted from the vibrator based on a driving vibration excited on the vibrator and a physical quantity to be measured, the synchronous wave detection comparator that generates a reference signal for synchronous wave detection is provided. The synchronous wave detection comparator generates the reference signal based on a signal in the oscillation loop, and a driving vibration is excited on the vibrator while switching between a given set voltage and an output of the synchronous wave detection comparator based on a signal in the oscillation loop at the time of oscillation startup. By this, the synchronous wave detection comparator that is necessary for synchronous wave detection processing can also be used as a means for achieving a quicker oscillation startup, and thus can realize both synchronous wave detection processing and higher-speed oscillation startup. Moreover, energy is injected in the vibrator at the output side of the synchronous wave detection comparator by the function of the synchronous wave detection comparator and the switch circuit at the time of oscillation startup, and the energy is supplied only to the vibrator without being supplied to another analog circuit in the oscillation loop, such that oscillation of the vibrator can be reliably started. Furthermore, since the aforementioned energy is a noise component for the other analog circuit, the structure according to the present embodiment can suppress malfunction of the analog circuit and wasteful power consumption.

(5) In accordance with another aspect of the embodiment of the invention, in the stationary oscillation state in which oscillation in the oscillation loop is detected by the oscillation detector, an output of the synchronous wave detection comparator may be outputted as the reference signal based on the switching control signal, and the first switch circuit may electrically connect the output of the comparator with the vibrator based on the switching control signal.

According to the embodiment described above, in addition to the effects described above, the output of the synchronous wave detection comparator is continuously connected with the vibrator in the stationary oscillation state, whereby the stationary oscillation state can be continued with a simple structure.

(6) In accordance with another aspect of the embodiment of the invention, the polarity of the output of the comparator may be the same as the polarity of the output of the synchronous wave detection comparator.

In addition to the effects described above, the embodiment described above makes it unnecessary to add a circuit for inverting polarity, for example, even when the oscillation loop is switched, whereby an increase in the circuit scale can be suppressed.

(7) In accordance with another aspect of the embodiment of the invention, the set voltage may be a voltage between a high potential side voltage of the synchronous wave detection comparator and a low potential side voltage of the synchronous wave detection comparator.

According to the embodiment described above, even in the case where the output of the synchronous wave detection comparator could be fixed to the side of the high potential side voltage or to the side of the low potential side voltage because the amplitude of a signal in the oscillation loop is small at the time of oscillation startup, the output of the synchronous wave detection comparator will not be fixed at the time of oscillation startup, regardless of variations in the temperature condition, the power supply condition and the process condition, and oscillation of the vibrator can be reliably started.

(8) In accordance with another aspect of the embodiment of the invention, the comparator may be a gain control amplifier that excites the oscillation amplitude in the oscillation loop to the driving vibration of the vibrator.

According to the embodiment described above, when the comparator forms an oscillation loop, the oscillation amplitude in the oscillation loop can be controlled, and the stationary oscillation state can be readily continued, in addition to the effects described above.

(9) In accordance with another aspect of the embodiment of the invention, the signal generation circuit may generate the switching control signal having a given frequency only during a predetermined period measured with the start timing of power-on reset of the oscillation drive device as a reference.

According to the embodiment described above, for specifying the start timing of a predetermined period, a circuit that is required for controlling the oscillation amplitude in the oscillation loop may be appropriated, or the circuit for detecting the level in the oscillation loop may be omitted, whereby an increase in the circuit scale can be suppressed. By clearly defining the start timing of the predetermined period, user-friendliness can be improved. Moreover, for example, the duration of the predetermined period can be defined by counting given reference clocks with the start timing being used as a reference. Therefore, for example, a circuit for detecting the oscillation amplitude can be omitted whereby the circuit scale can be reduced.

(10) In accordance with another aspect of the embodiment of the invention, an end timing of the predetermined period may be a timing at which the signal in the oscillation loop exceeds a predetermined threshold level is detected, or a predetermined count number is counted with the start timing of the predetermined period being used as a reference.

According to the embodiment described above, for specifying the end timing of the predetermined period, a circuit that is required for controlling the oscillation amplitude in the oscillation loop may be appropriated, or the circuit for detecting the level in the oscillation loop may be omitted, whereby an increase in the circuit scale can be suppressed.

(11) In accordance with another aspect of the embodiment of the invention, the signal generation circuit may include a power-on reset circuit that generates a power-on reset signal, and a pulse generation circuit that generates a pulse or a plurality of pulses based on the power-on reset signal within a predetermined period, wherein the pulse generation circuit includes a plurality of delay units wherein each of the delay units generates a pulse based on an input signal, and each of the delay units outputs a calculation result of logical sum of the generated pulses, wherein the signal with the given frequency is outputted during a period starting with the timing of a change in the power-on reset signal as a reference until the timing of a change in the detection result signal indicating that the signal in the oscillation loop exceeds the predetermined threshold level.

According to this embodiment, the structure of the signal generation circuit can be simplified.

(12) Another embodiment of the invention pertains to a physical quantity measurement device that measures a physical quantity corresponding to a detection signal that is outputted from a vibrator, based on a driving vibration excited by the vibrator and a physical quantity to be measured. The physical quantity measurement device includes a vibrator, any one of the oscillation drive devices described above for exciting a driving vibration in the vibrator, and a detection device that detects an output signal corresponding to the physical quantity based on the detection signal, wherein the detection device includes a synchronous wave detector that synchronously detects the detection signal based on an output of a synchronous wave detection comparator that generates a reference signal for synchronous wave detection based on a signal in the oscillation loop.

According to the embodiment described above, it is possible to provide a physical quantity measurement device using an oscillation drive device that can reliably oscillate and shorten the oscillation startup time.

(13) In accordance with another aspect of the embodiment of the invention, the detection device may include a phase shifter for adjusting phases of an output of the synchronous wave detection comparator and the detection signal.

According to the embodiment described above, phase adjustment can be performed according to infinitesimal phase changes in the detection signal during detection processing, such that highly accurate phase adjustment and prevention of an increase in circuit scale can both be achieved.

(14) In accordance with still another embodiment of the invention, an electronic apparatus includes any one of the physical quantity measurement devices described above.

According to the embodiment described above, it is possible to provide an electronic apparatus including a physical quantity measurement device that can reliably oscillate and shorten the oscillation startup time. This embodiment contributes to reducing the size and power consumption of an electronic apparatus that performs a predetermined processing using results of measurement of physical quantity.

BRIEF DESCRIPTION OF THE DRAWINGS

FIG. 148 is a timing chart of an example operation of the analog control logic section of FIG. 14A.

DESCRIPTION OF EXAMPLE EMBODIMENTS

Preferred embodiments of the invention are described in detail below with reference to the accompanying drawings. It is noted that the embodiments described below do not unduly limit the content of the invention recited in the scope of the claimed invention, and all of the compositions to be described in the embodiments may not necessarily be indispensable as means for solution provided by the invention.

1. Oscillation Drive Device

Figure 1:
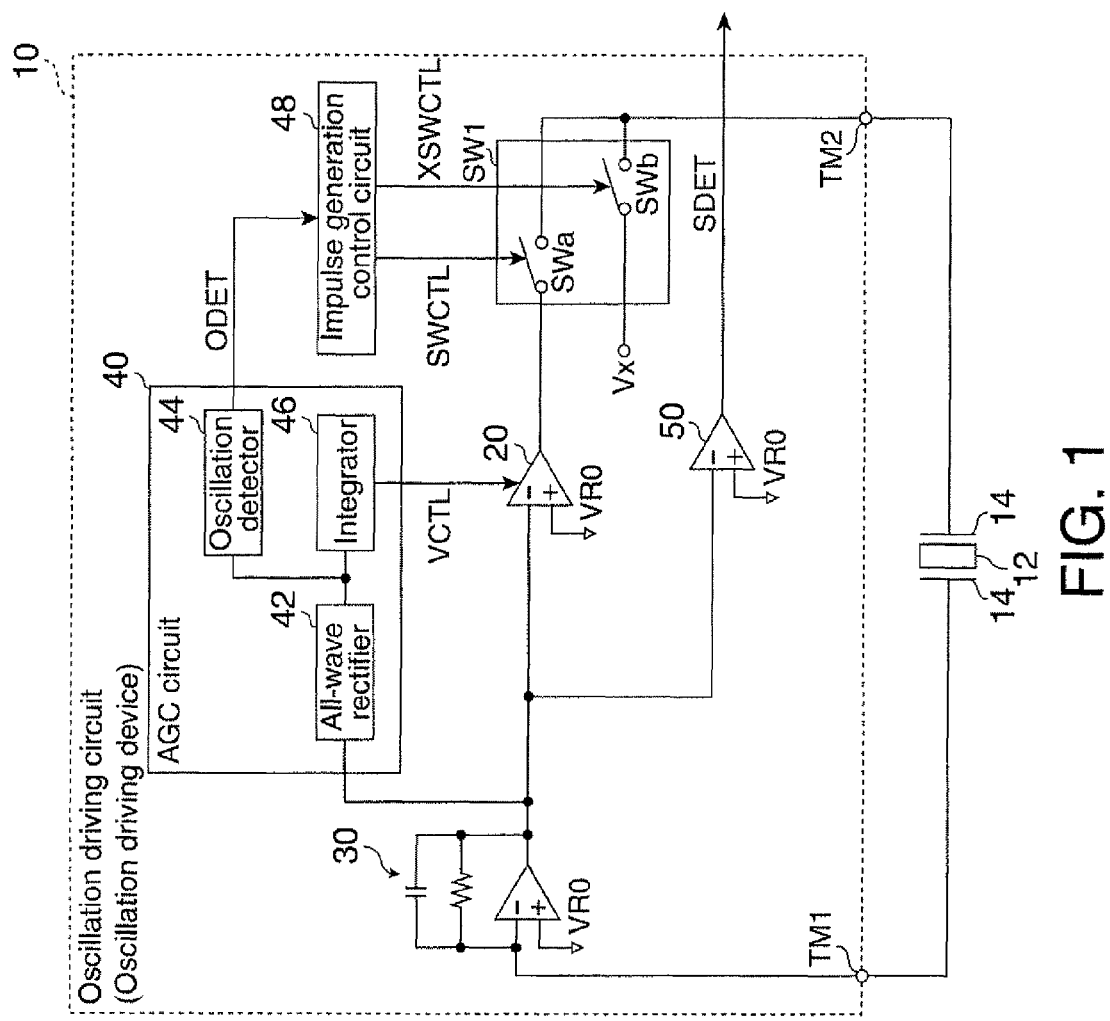
FIG. 1 is a circuit block diagram of a composition example of an oscillation drive circuit in accordance with Embodiment 1.

FIG. 1 shows a block diagram of a composition example of an oscillation drive circuit, as an oscillation drive device in accordance with Embodiment 1 of the invention. The oscillation drive circuit in accordance with Embodiment 1 is used to measure physical quantities, using a driving vibration excited on a vibrator and an output signal that is obtained by synchronously detecting a detection signal that is outputted from the vibrator based on a physical quantity to be measured.

The oscillation drive circuit 10 is provided with first and second connection terminals TM1 and TM2 (electrodes or pads), and a vibrator 12 is inserted, outside the oscillation drive circuit 10, between the first and second connection terminals. An excitation device 14 is attached to the vibrator 12, and the excitation device 14 is connected to the oscillation drive circuit 10, thereby forming an oscillation loop.

With the oscillation drive circuit 10, an oscillation is started in a state in which the gain of a driver in the oscillation drive circuit 10 is large (i.e., the gain is greater than 1). At this moment, only noise is inputted to the driver. The noise includes wave motions with a wide range of frequencies including the natural resonance frequency of the target driving vibration. This noise is inputted to the vibrator 12.

The vibrator 12 is formed of a piezoelectric single crystal as described below, for example. A signal containing a large amount of wave motions with the desired natural resonance frequency is outputted by the frequency filtering effect of the vibrator 12, and inputted to the driver. The above operation is repeated in the oscillation loop so that the rate of the signal at the desired natural resonance frequency increases, whereby the amplitude of the signal input to the driver increases.

In the stationary oscillation state, the output current from the vibrator 12 is converted into a voltage value using a current-voltage converter 30, and the oscillation amplitude in the oscillation loop is controlled using an auto gain control (AGC) circuit (a gain control circuit in a broad sense) 40 based on the voltage value. This causes the gain (loop gain) while the signal goes around the oscillation loop to become a unity gain, whereby the vibrator 12 stably oscillates.

Stable oscillations of the vibrator are indispensable for the measurement of the physical quantity. Specifically, if the amplitude of the driving signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be started only when required by promptly obtaining stable oscillations, whereby an operation period in which power is wastefully consumed can be reduced.

In Embodiment 1, the oscillation drive circuit 10 utilizes a gain control amplifier (hereinafter abbreviated as GCA) 20 as the driver. The GCA 20, whose gain is controlled by the AGC circuit 40, may function as a comparator.

More specifically, the oscillation drive circuit 10 includes the GCA 20 provided in the oscillation loop and a first switch circuit SW1. The oscillation drive circuit 10 further includes an impulse generation control circuit 48 as a signal generation circuit, wherein the impulse generation control circuit 48 generates switching control signals with given frequencies (for example, switching control signals SWCTL and XSWCTL in FIG. 1), and the first switch circuit SW1 is ON/OFF controlled by the switching control signals (e.g., the switching control signals SWCTL and XSWCTL). The switching control signal XSWCTL is a logic inversion signal of the switching control signal SWCTL.

The first switch circuit SW1 may electrically connect the vibrator 12 to the output of the GCA 20 based on the switching control signal SWCTL, and apply a given set voltage Vx to the vibrator 12. The first switch circuit SW1 may include, for example, switch elements SWa and SWb. The switch element SWa may electrically connect the output of the GCA 20 with the vibrator 12 or shut them off based on the switching control signal SWCTL, and the switch element SWb may or may not apply the set voltage Vx to the vibrator 12 based on the switching control signal XSWCTL. It is noted that the composition of the first switch circuit SW1 is not limited to the composition shown in FIG. 1.

It is noted that the set voltage Vx may preferably be a voltage between a high potential side voltage and a low potential side voltage of the GCA 20 that functions as a comparator, and for example, may be an intermediate voltage between the high potential side voltage and the low potential side voltage of the GCA 20. By so doing, even in the case where the output of the GCA 20 could be fixed to H side (the high potential side voltage) or to L side (the low potential side voltage) due to a small signal amplitude in the oscillation loop at the time of oscillation startup, the output of the GCA 20 will not be fixed at the time of oscillation startup, and oscillation of the vibrator 12 can be reliably started. Furthermore, by using the intermediate voltage between the high potential side voltage and the low potential side voltage of the GCA 20, the set voltage Vx can be generated by a circuit with a simple structure. It is noted that the set voltage Vx may not be a fixed voltage, but may be a voltage with a given frequency, which changes between the high potential side voltage and the low potential side voltage of the GCA 20.

The oscillation drive circuit 10 uses the first switch circuit SW1 to connect the vibrator 12 to the output of the GCA 20 and to apply the predetermined set voltage Vx to the vibrator 12 thereby exciting a driving vibration on the vibrator 12, and then controls the oscillation amplitude in the oscillation loop that is formed by the vibration 12 and the GCA 20, thereby exciting the driving vibration on the vibrator 12.

In general, in the oscillation loop, the vibrator 12 allows only a resonance frequency component contained in white noise in the oscillation loop to pass through. As a result, only a resonance frequency signal component is amplified, whereby the vibrator starts oscillation. Specifically, an ordinary oscillation circuit amplifies only a resonance frequency component of the vibrator 12 contained in intrinsic noise (particularly white noise) in the oscillation loop to cause the vibrator to oscillate. However, intrinsic noise substantially changes due to changes in temperature conditions, power supply conditions, and process conditions. Therefore, the period of time until a stationary oscillation state is achieved after oscillation startup also changes to a large extent due to changes in temperature conditions, power supply conditions, and process conditions.

In contrast, according to Embodiment 1, energy is injected in the vibrator 12 by the operation of the GCA 20 and the first switch circuit SW1 at the time of oscillation startup such that, even in the case where the output of the GCA 20 could be fixed to H side (high potential side voltage supply) or L side (low potential side voltage supply) because the signal amplitude in the oscillation loop is small at the time of oscillation startup, the output of the GCA 20 will not be fixed at the time of oscillation startup and the vibrator 12 can be reliably caused to oscillate regardless of changes in temperature conditions, power supply conditions, and process conditions and, in addition, the period of time after oscillation starts up until the oscillation reaches a stationary oscillation state can be reliably shortened.

Moreover, in the oscillation drive circuit 10, the first switch circuit SW1 is provided on the output side of the GCA 20 in the oscillation loop, and is provided in a manner to be electrically connected to one end of the vibrator 12. By this, a signal that is switched by the first switch circuit SW1 is supplied only to the vibrator 12 without being supplied to another analog circuit in the oscillation loop. The signal that is switched by the first switch circuit SW1 is a noise component for the other analog circuit, such that, with the structure described above, malfunction of the analog circuit and wasteful power consumption can be suppressed.

Furthermore, the oscillation drive circuit 10 is provided with a comparator 50 (a synchronous wave detection comparator) in parallel with the GCA 20. The comparator 50 is connected to the input of the GCA 20, and the oscillation drive circuit 10 can output an output signal SDET of the comparator 50 as a clock for synchronous wave detection that is a reference signal for synchronous wave detection.

In the oscillation drive circuit 10 described above, the AGC circuit 40 includes a full-wave rectifier 42, an oscillation detector 44 as a startup comparison judging circuit, and an integrator 46 as a drive current comparison judging circuit. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and outputs a detection signal ODET corresponding to the detection result to the impulse generation control circuit 48. For example, the oscillation detector 44 compares the voltage value converted by the full-wave rectifier 42 with a given reference voltage value, and the impulse generation control circuit 48 generates the switch control signals SWCTL are XSWCTL based on the comparison result of the oscillation detector 44. The integrator 46 generates a control signal VCTL for the GCA 20 to control oscillations in the oscillation loop based on an integration result of the voltage value converted by the full-wave rectifier 42. For example, the integrator 46 integrates the voltage value converted by the full-wave rectifier 42 to obtain the level of the direct-current component, compares the obtained level with a given reference signal level, and generates the control signal VCTL based on the comparison result. For example, the high-potential-side power supply voltage of a circuit (output circuit) in the output stage (final stage) of the GCA 20 is controlled based on the control signal VCTL, and the output level of the GCA 20 is controlled based on the control signal VCTL.

The impulse generation control circuit 48 generates the switch control signals SWCTL and XSWCTL using the detection result of the oscillation detector 44, as described above. The switching control of the first switch circuit SW1 by the switch control signals SWCTL and XSWCTL gives a signal with a high frequency in the oscillation loop. For this reason, the vibrator 12 is given a signal with a high frequency as a startup signal.

Figure 2:
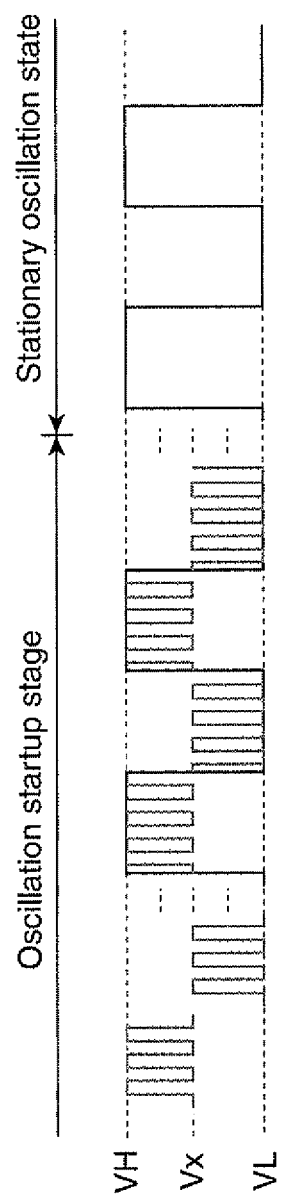
FIG. 2 is a diagram schematically showing an example operation of the oscillation drive circuit in accordance with Embodiment 1.

An ideal impulse contains all frequency components and therefore necessarily contains a frequency component which works as a seed for oscillation startup in the oscillation loop. Therefore, by giving an impulse signal to the oscillation loop, the energy is reliably injected by its component that coincides with the resonance frequency of the vibrator 12. However, it is difficult to generate an ideal impulse signal. Thus, according to Embodiment 1, a signal with a high frequency that is generated by performing the switching control described above is generated as a pseudo-impulse, whereby the vibrator 12 is reliably and smoothly started up, and the oscillation startup time is shortened, FIG. 2 is a diagram schematically showing an operation example of the oscillation drive circuit 10 in accordance with Embodiment 1. FIG. 2 schematically represents signals in the oscillation loop in an oscillation startup stage and signals in the oscillation loop in a stationary oscillation state.

The oscillation startup stage is a state in which the oscillation detector 44 of FIG. 1 does not detect oscillation in the oscillation loop. The stationary oscillation state is a state in which the oscillation detector 44 of FIG. 1 detects oscillation in the oscillation loop.

At the time of oscillation startup, an oscillation operation of the signal is started based on the seed frequency component for oscillation startup in the oscillation loop. At this moment, if the amplitude of the signal inputted in the GCA 20 is not sufficient, and the oscillation of the signal is in the neighborhood of the threshold voltage of the GCA 20, the output of the GCA 20 may be at the high potential side power supply voltage VH of the GCA 20 or at the low potential side power supply voltage VL of the GCA 20. This state alone may fix the output of the GCA 20 to either of the voltages at the time of oscillation startup.

Therefore, according to Embodiment 1, a set voltage Vx between the high potential side power supply voltage VH and the low potential side power supply voltage VL of the GCA 20 is prepared, and the output of the GCA 20 is periodically switched to the set voltage Vx and is given to the vibrator 12. This is realized by the switching control of the first switch circuit SW1 using the switching control signals SWCTL and XSWCTL. In the oscillation startup stage in which oscillation in the oscillation loop is not detected by the oscillation detector 44, the first switch circuit SW1 can alternately switch between the period in which the output of the GCA 20 is electrically connected to the vibrator 12 and the period in which the given set voltage Vx is supplied to the vibrator 12 based on the switching control signals SWCTL and XSWCTL.

Thereafter, when the stationary oscillation state is established, the first switch circuit SW1 continues electrically connecting the output of the GCA 20 with the vibrator 12 based on the switching control signal SWCTL. Accordingly, the oscillation state is continued in a state in which the gain in the oscillation loop is controlled by the GCA 20.

Referring to FIG. 2, in the oscillation startup stage, for example, even in the case where the output of the GCA 20 could be fixed to the high potential side power supply voltage VH like in the case of a conventional technology, the high potential side power supply voltage VH and the set voltage Vx are periodically given to the vibrator 12. Also, for example, even in the case where the output of the GCA 20 could be fixed to the low potential side power supply voltage VL like in the case of a conventional technology, the low potential side power supply voltage VL and the set voltage Vx are periodically given to the vibrator 12.

In this manner, even in the case where the output of the GCA 20 could be fixed to either of the voltages like in the case of a conventional technology, pulses are forcefully given to the vibrator 12, such that oscillation startup of the vibrator 12 can be reliably achieved. Moreover, in the oscillation startup stage, the energy is injected in the oscillation loop by the high potential side power supply voltage V11 and the low potential side power supply voltage VL of the GCA 20, whereby the oscillation startup time can be shortened.

Next, detailed composition examples of the components of the oscillation drive circuit 10 will be described.

1.1. Concrete Composition Examples

Figure 3:
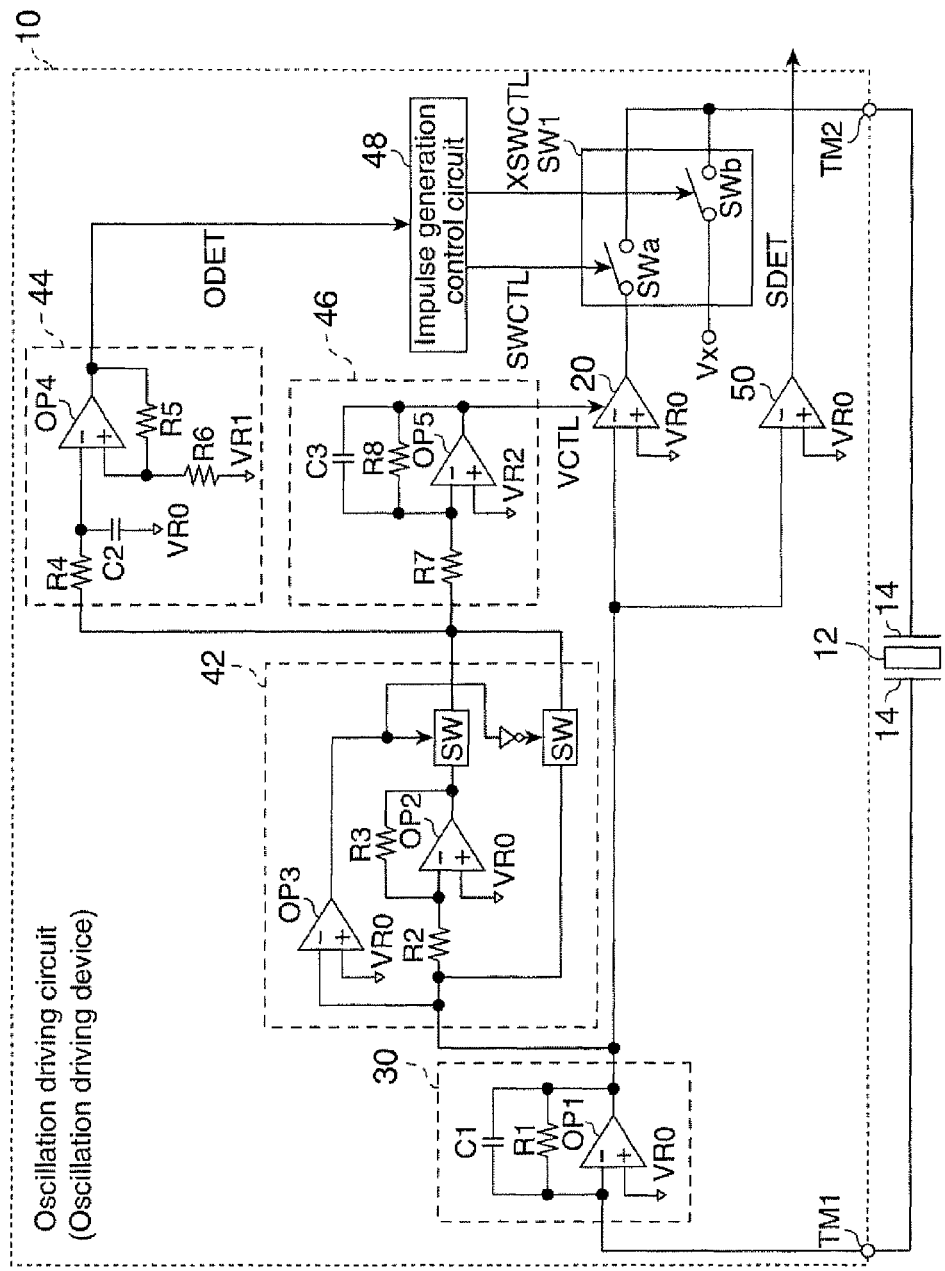
FIG. 3 is a circuit diagram of a composition example of the oscillation drive circuit shown in FIG. 1.

FIG. 3 is a circuit diagram of a composition example of the oscillation drive circuit 10 of FIG. 1. Components of FIG. 3 that are the same as those of FIG. 1 will be appended with the same reference numbers, and their description may be omitted if appropriate.

1.1.1. Composition Example of AGC Circuit

The AGC circuit 40 includes a full-wave rectifier 42, an oscillation detector 44 and an integrator 46.

The current-voltage converter 30 includes an operational amplifier OP1, a feedback capacitor C1, and a feedback resistor R1. A given reference voltage VR0 is supplied to a non-inverting input terminal (+) of the operational amplifier OP1, and a first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is outputted as the detection result signal ODET.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage VR2 is supplied to the non-inverting input terminal of the operational amplifier OP5. The integrator 46 functions as an LPF utilizing the capacitor C3 and the resistor R8. The cut-off frequency is $1/(2\pi \times C3 \times R8)$. The output signal from the operational amplifier OP5 is supplied to the GCA 20 as the control signal VCTL.

The current which flows through the vibrator 12 in the oscillation startup stage is referred to as Id, and the current which flows through the vibrator 12 in the stationary oscillation state is referred to as Id'. The reference voltage VR2 is expressed by the following formula taking into account the smoothing by the current-voltage converter 30.

$$VR2 = (Id \times R1 \times 2/\pi) + VR0 \quad (1)$$

In the above formula, R1 indicates the resistance of the feedback resistor of the current-voltage converter 30. Similarly, the reference voltage VR1 is expressed by the following formula.

$$VR1 = (Id' \times R1 \times 2/\pi) + VR0 \quad (2)$$

Since Id'<Id, the reference voltage VR2 is higher than the reference voltage VR1 (VR2>VR1). It is preferable that the reference voltages VR1 and VR2 have the following relationship with the reference voltage VR0.

$$VR0 < VR1 < VR2 \quad (3)$$

1.1.2. Composition Example of GCA

Figure 4A:
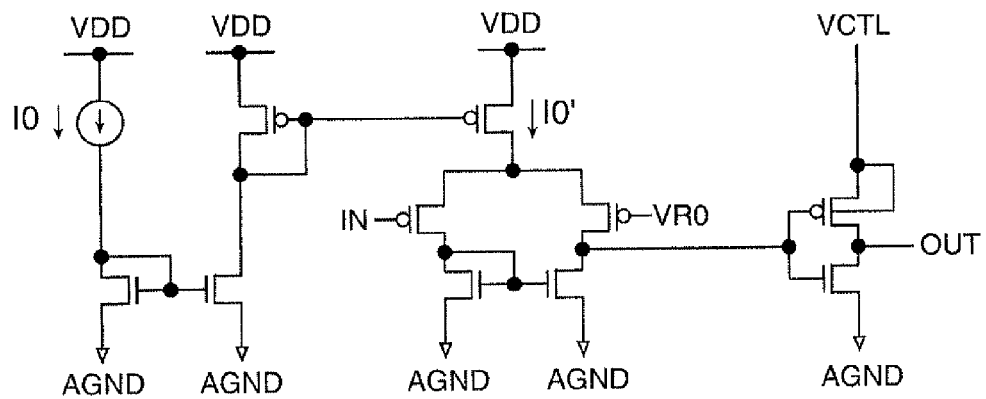
FIG. 4A and FIG. 4B are circuit diagrams of composition examples GCAs.
Figure 4B:
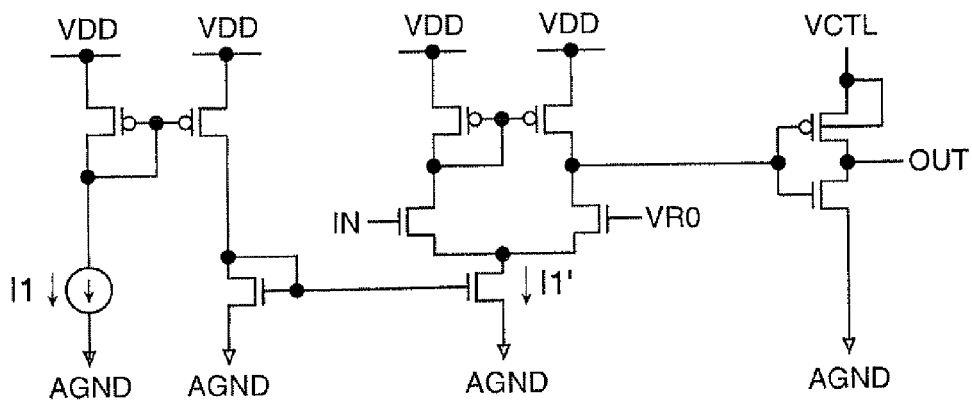

FIGS. 4A and 4B are circuit diagrams of composition examples of the GCA 20 of FIG. 3. FIG. 4A shows the composition example when the GCA 20 is formed from a P-type differential amplifier, and FIG. 4B shows the composition example when the GCA 20 is formed from an N-type differential amplifier.

In FIG. 4A, a current I0 generated by a current source is supplied as an operating current I0' of the P-type differential amplifier through two current-mirror circuits. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied to an output buffer. The signal output from the output buffer is supplied to one end of the first switch element SW1.

The high potential side power supply voltage and the low potential side power supply voltage of the two current-mirror circuits and the P-type differential amplifier are voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor.

In FIG. 4B, a current I1 generated by a current source is supplied as an operating current I1' of the N-type differential amplifier through two current-mirror circuits. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied to an output buffer. The signal output from the output buffer is supplied to one end of the first switch element SWs of the first switch circuit SW1.

The high-potential-side power supply voltage and the low-potential-side power supply voltage of the two current-mirror circuits and the N-type differential amplifier are the voltages VDD and AGND, respectively. The output buffer is an inverter circuit formed from a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIGS. 4A and 4B, a substrate bias effect can be prevented by applying the control signal VCTL as the substrate potential of the P-type output transistor of the output buffer.

1.1.3. Composition Example of Impulse Generation Control Circuit

Figure 5:
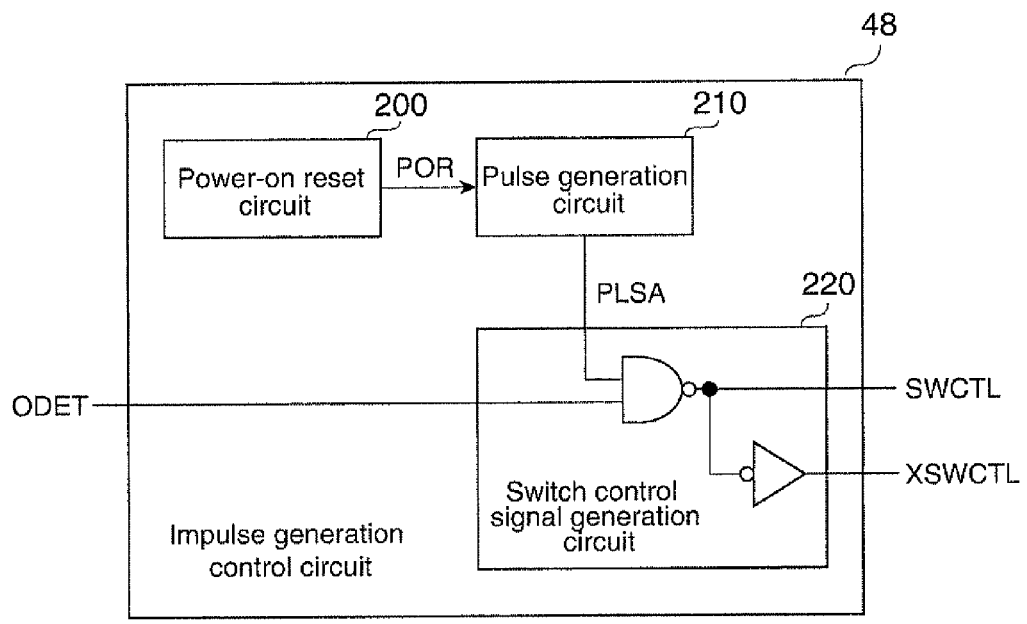
FIG. 5 is a block diagram of a composition example of an impulse generation control circuit shown in FIG. 1.

FIG. 5 is a block diagram of a composition example of the impulse generation control circuit 48 of FIG. 1.

The impulse generation control circuit 48 includes a power-on reset circuit 200, a pulse generation circuit 210, and a switching control signal generation circuit 220. The impulse generation control circuit 48 receives a detection signal ODET from the oscillation detector 44, and outputs switching control signals SWCTL and XSWCTL which are output-controlled by the detection signal ODET.

The power-on reset circuit 200 generates a power-on reset signal POR. The pulse generation circuit 210 outputs a pulse signal PLSA based on the power-on reset signal POR.

Figure 6:
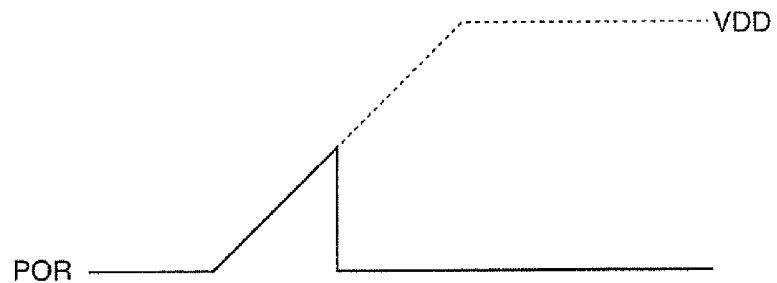
FIG. 6 is a diagram for describing an operation of a power-on reset circuit shown in FIG. 5.

FIG. 6 is a diagram for describing operations of the power-on reset circuit 200 of FIG. 5.

The power-on reset circuit 200 generates the power-on reset signal POR in a manner to become active, during a period from the time immediately after the power has been turn on to the time at which the high potential side of the power supply voltage reaches the voltage VDD, when the power supply voltage reaches a given threshold level. The power-on reset circuit 200 may be structured with a known circuit.

The pulse generation circuit 210 generates a pulse signal PLSA which contains one or more pulses in a predetermined period based on the power-on reset signal POR from the power-on reset circuit 200. The pulse generation circuit 210 can output a delay signal DLY which becomes to be H level only in the above period.

Figure 7A:
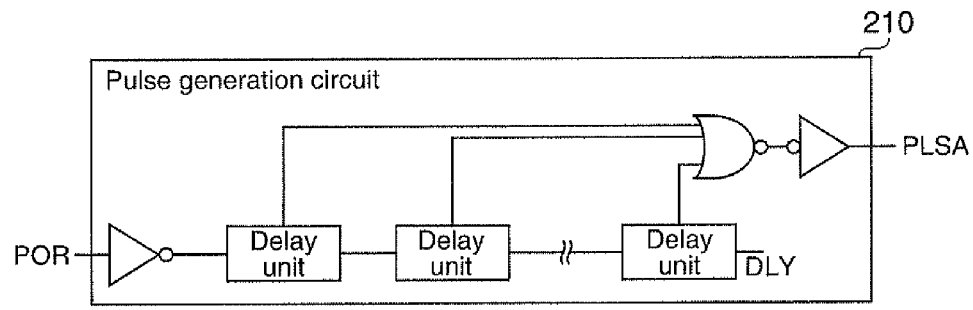
FIGS. 7A-7D are diagrams and charts for describing a pulse generation circuit shown in FIG. 5.
Figure 7B:
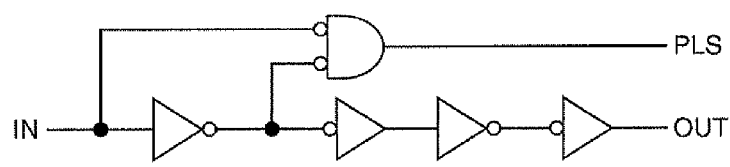
Figure 7C:
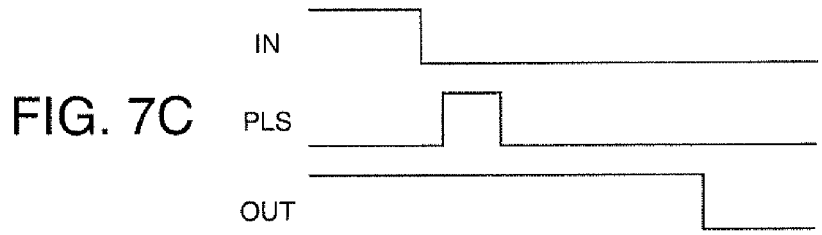
Figure 7D:
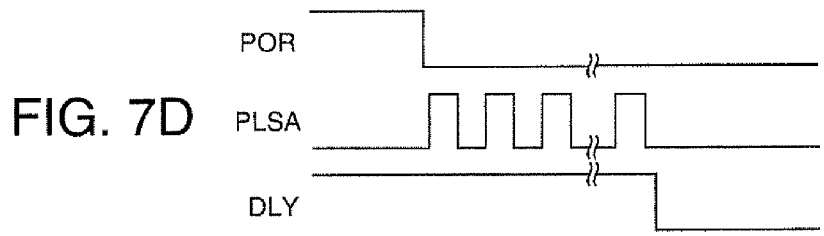

FIGS. 7A to 7D are views illustrative of the pulse generation circuit 210 shown in FIG. 5. FIG. 7A is a block diagram showing a composition example of the pulse generation circuit 210 shown in FIG. 5. FIG. 7B is a circuit diagram of a composition example of a delay unit shown in FIG. 7A. FIG. 7C shows a timing example of the delay unit shown in FIG. 7B. FIG. 7D is a timing diagram showing an operation example of the pulse generation circuit 210 shown in FIG. 7A.

As shown in FIG. 7A, the pulse generation circuit 210 includes a plurality of delay units. Each delay unit generates one pulse based on an input signal. The power-on reset signal POR is inputted to the delay unit in the first stage. The pulses generated by the delay units are logical ORed and outputted as the pulse signal PLSA.

As shown in FIGS. 7B and 7C, the delay unit delays the input signal IN using a series of inverters, and generates an output signal OUT which is inputted to the delay unit in the subsequent stage. The pulse signal PLS outputted from each delay unit is generated by the input and the output of a first-stage inverter circuit of the series of inverters, and is outputted as a falling-edge detection pulse of the input signal IN. The pulse signal PLSA is generated by logical ORing the pulse signals PLS from the delay units. The output signal OUT falls after a delay time due to the series of inverters based on the falling edge of the input signal IN.

By logical ORing the pulse signals from the delay units shown in FIGS. 7B and 7C, the pulse signal PLSA having pulses in the number of the delay units in a specific period which starts based on the falling edge of the power-on reset signal POR as shown in FIG. 7D is generated.

Referring back to FIG. 5, the description is continued. The detection signal ODET from the oscillation detector 44 and the pulse signal PLSA are inputted to the switch control signal generation circuit 220 shown in FIG. 5. The switch control signal generation circuit 220 generates switch control signals SWCTL and XSWCTL each having one or more pulses in a specific period based on the detection signal ODET and the pulse signal PLSA. More specifically, the switch control signal generation circuit 220 generates the switch control signal SWCTL and its logically inverted signal, the switch control signal XSWCTL, by mask-controlling the pulse signal PLSA by the detection signal ODET.

According to the above configuration, the impulse generation control circuit 48 can output the switch control signals SWCTL and XSWCTL (signal at a given frequency) having one or more pulses in a period from the falling edge (change timing) of the power-on reset signal POR to the falling edge (change timing) of the detection signal ODET which indicates that the signal in the oscillation loop has exceeded a specific threshold value level.

By clearly defining the start timing, user-friendliness can be improved. Furthermore, for example, the duration of the predetermined period can be defined by counting given reference clocks with the start timing as a reference. Therefore, for example, the oscillation detector 44 for detecting the oscillation amplitude may be omitted, and the circuit scale can be reduced.

It is noted that the impulse generation control circuit 48 is not limited to the composition shown in FIG. 5. For example, in FIGS. 5, 7A and 7B, the circuit is described as generating a fixed number of pulses in the number of the delay units, but the invention is not limited to this composition. For example, the clock number of the output of the oscillation circuit may be counted based on the change timing of the power-on reset signal POR, and the output of the oscillation circuit may be outputted as switching signals SWCTL and XSWCTL during a period until a predetermined count value is reached. In this case, the finish timing of the specific period in which the impulse generation control circuit 48 outputs the switch control signals SWCTL and XSWCTL in a pulsed manner may be the timing at which it has been detected that the predetermined count number is counted based on the start timing of the predetermined period.

Embodiment 2

The oscillation drive device in accordance with the invention is not limited to the composition of Embodiment 1. An oscillation drive device in accordance with Embodiment 2 of the invention does not switch the output of the GCA 20 to the set voltage Vx in the oscillation startup stage, but instead, uses the output of the comparator 50 to perform oscillation startup in the oscillation startup stage, and also appropriately switches the output of the comparator 50 to the set voltage Vx to perform oscillation amplitude control by the GCA 20 in the stationary oscillation state.

2. Oscillation Drive Device

Figure 8:
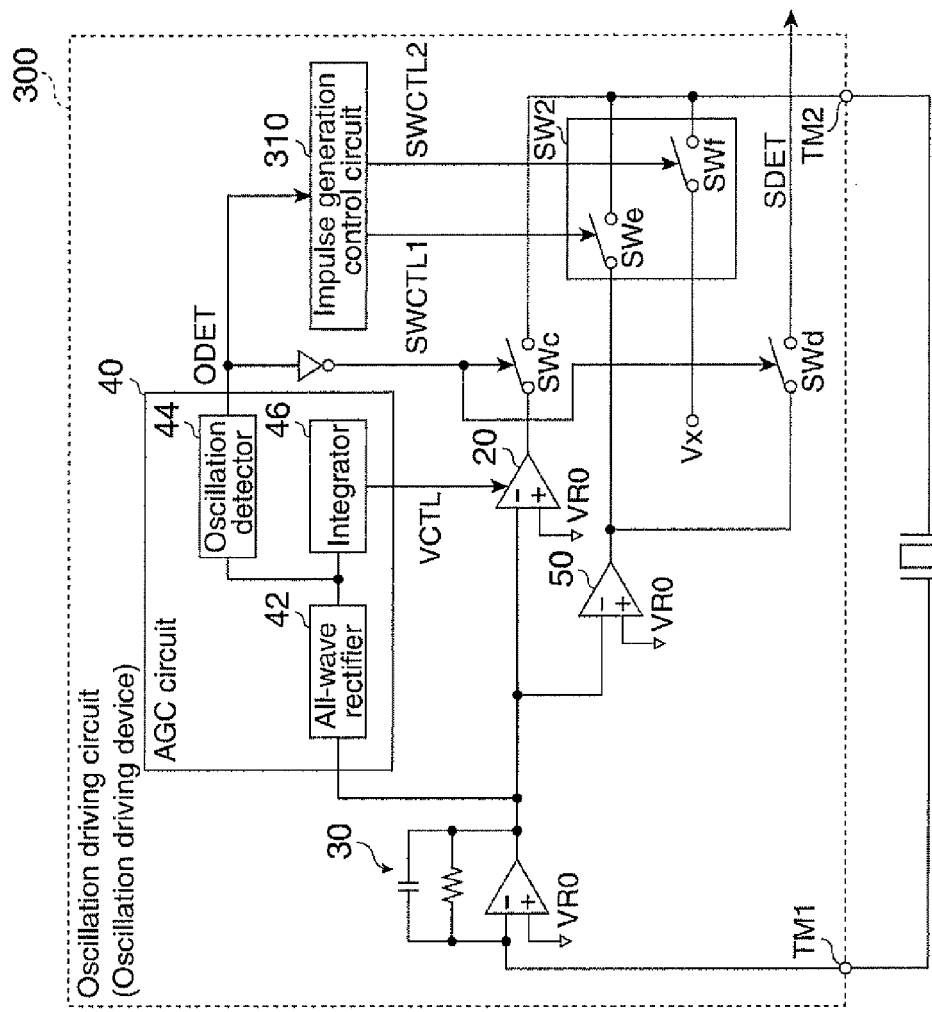
FIG. 8 is a circuit block diagram of a composition example of an oscillation drive circuit in accordance with Embodiment 2.

FIG. 8 is a block diagram of a composition example of the oscillation drive circuit, as an oscillation drive device in accordance with Embodiment 2 of the invention. Components of FIG. 8 that are the same as those of FIG. 1 will be appended with the same reference numbers, and their description may be omitted if appropriate.

An oscillation drive circuit 300 in accordance with Embodiment 2 is different from the oscillation drive circuit 100 in accordance with Embodiment 1 in that a switch element SWc (a first switch circuit in a broad sense) is provided at the output of the GCA 20 instead of the first switch circuit SW1, and a second switch circuit SW2 and a switch element SWd are provided at the output of the comparator 50, and an impulse generation control circuit 310 is provided in place of the impulse generation control circuit 48.

The switch element SWd is inserted between the output of the GCA 20 and a second connection terminal TM2, and is ON/OFF controlled based on a detection signal ODET from the oscillation detector 44. The switch element SWe is connected to the output of the comparator 50, and is ON/OFF controlled based on the detection signal ODET from the oscillation detector 44. The output signal SDET of the comparator 50 is a clock for synchronous wave detection as a reference signal for synchronous wave detection. The switch elements SWc and SSd are similarly ON/OFF controlled, so that the switch element SWd is set in a conductive state when the switch element SWc is in a conductive state, and the switch element SWd is set in a non-conductive state when the switch element SWc is in a non-conductive state.

In contrast, the second switch circuit SW2 is inserted between the output of the comparator 50 and the second connection terminal TM2. The second switch circuit SW2 includes switch elements SWe and SWf. The switch element SWe is capable of electrically connecting the output of the comparator 50 with the vibrator 12 or shutting them off based on a switching control signal SWCTL1 from the impulse generation control circuit 310. The switch element SWf may or may not apply the set voltage Vx to the vibrator 12 based on the switching control signal SWCTL from the impulse generation control circuit 310. It is noted that the composition of the second switch circuit SW2 is not limited to the composition shown in FIG. 8.

It is noted that, in accordance with Embodiment 2, the set voltage Vx may also preferably be a voltage between a high potential side voltage and a low potential side voltage of the comparator 50, and for example, may be an intermediate voltage between the high potential side voltage and the low potential side voltage of the comparator 50. By so doing, even in the case where the output of the comparator 50 could be fixed to H side (the high potential side voltage) or to L side (the low potential side voltage) because the signal amplitude in the oscillation loop is small at the time of oscillation startup, the output of the comparator 50 will not be fixed at the time of oscillation startup, and oscillation of the vibrator 12 can be reliably started. Also, the set voltage Vx may not have to be a fixed voltage, and may be a voltage that changes, for example, with a given frequency, between the high potential side voltage and the low potential side voltage of the comparator 50.

The impulse generation control circuit 310 generates switch control signals SWCTL1 and SWCTL2 based on the detection result of the oscillation detector 44. The switch control of the second switch circuit SW2 by the switch control signals SWCTL1 and SWCTL2 gives a signal with a high frequency in the oscillation loop. For this reason, the vibrator 12 is given a signal with a high frequency as a startup signal.

In the oscillation drive circuit 300, the switch elements SWc and SWd are set in a non-conductive state by the detection signal ODET in the oscillation startup stage, and the oscillation startup in the oscillation loop is performed by the comparator 50. Therefore, the second switch circuit SW21 is capable of connecting the output of the GCA 20 to the vibrator 12 and applying the given set voltage Vx to the vibrator 12 during the oscillation startup process, whereby the vibrator 12 can be excited to generate driving vibrations. Then, after the oscillation has started, the switch elements SWc and SWd are set in a conductive state, whereby the oscillation amplitude in the oscillation loop that is formed from the vibrator 12 and the GCA 20 is controlled, to excite the vibrator 12 to generate driving vibrations, and the clock for synchronous wave detection, which is the output signal SDET of the comparator 50 is outputted.

Accordingly, likewise in Embodiment 2, in the oscillation drive circuit 300, the second switch circuit SW2 is provided on the output side of the comparator 50 in the oscillation loop, in a manner to be electrically connected to one end of the vibrator 12. Therefore, the signal that is switched by the second switch circuit SW2 is supplied only to the vibrator 12 without being supplied to another analog circuit in the oscillation loop. The signal that is switched by the second switch circuit SW2 is a noise component for the other analog circuit, such that, with the structure described above, malfunction of the analog circuit and wasteful power consumption can be suppressed.

Figure 9:
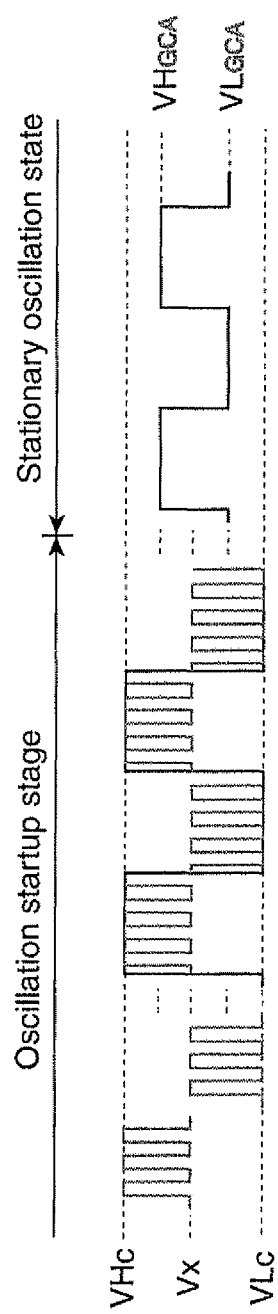
FIG. 9 is a diagram schematically showing an example operation of the oscillation drive circuit in accordance with Embodiment 2.

FIG. 9 is a diagram schematically showing an operation example of the oscillation drive circuit 300 in accordance with Embodiment 2. FIG. 9 schematically represents signals in the oscillation loop in the oscillation startup stage and signals in the oscillation loop in the stationary oscillation state.

Likewise in Embodiment 2, at the time of oscillation startup, an oscillation operation of the signal is started based on the oscillation startup seed in the oscillation loop. At this moment, as the switch element SWc is set in a non-conductive state, the amplitude of the signal inputted in the comparator 50 is not sufficient, and the oscillation of the signal is in neighbor of the threshold voltage of the comparator 50, the output of the comparator 50 may be at the high potential side power supply voltage VHc of the comparator 50 or at the low potential side power supply voltage VLc of the comparator 50. This state per se may fix the output of the comparator 50 to either of the voltages at the time of oscillation startup.

Therefore, according to Embodiment 2, a set voltage Vx between the high potential side power supply voltage VHc and the low potential side power supply voltage VLc of the comparator 50 is prepared, and the output of the comparator 50 is periodically switched to the set voltage Vx and is given to the vibrator 12. This is realized by the switching control of the second switch circuit SW2 using the switching control signals SWCTL1 and SWCTL2. In the oscillation startup stage in which oscillation in the oscillation loop is not detected by the oscillation detector 44, the second switch circuit SW2 can alternately switch between the period in which the output of the comparator 50 is electrically connected to the vibrator 12 and the period in which the given set voltage Vx is supplied to the vibrator 12 based on the switching control signals SWCTL1 and SWCTL2.

Thereafter, when the stationary oscillation state is established, the second switch circuit SW2 continues electrically connecting the output of the comparator 50 with the vibrator 12 based on the switching control signals SWCTL1 and SWCTL2. Accordingly, the oscillation state is continued in a state in which the gain in the oscillation loop is controlled by the comparator 50. In accordance with Embodiment 2, in the oscillation stationary state, the oscillation state is continued with voltage amplitudes of a high potential side power supply voltage $VH_{GCA}$ and a low potential side power supply voltage $VL_{GCA}$, such that the signal amplitudes in the oscillation loop are different in the oscillation startup stage and the oscillation stationary state, respectively.

Referring to FIG. 9, in the oscillation startup stage, for example, even in the case where the output of the comparator 50 could be fixed to the high potential side power supply voltage VHc like in the case of a conventional technology, the high potential side power supply voltage VHc and the set voltage Vx are periodically given to the vibrator 12. Also, for example, even in the case where the output of the comparator 50 could be fixed to the low potential side power supply voltage VLc like in the case of a conventional technology, the low potential side power supply voltage VLc and the set voltage Vx are periodically given to the vibrator 12.

In this manner, even in the case where the output of the comparator 50 could be fixed to either of the voltages like in the case of a conventional technology, pulses are forcefully given to the vibrator 12, such that oscillation startup of the vibrator 12 can be reliably achieved. Moreover, in the oscillation startup stage, the energy is injected in the oscillation loop by the high potential side power supply voltage VHc and the low potential side power supply voltage VLc of the comparator 50, whereby the oscillation startup time can be shortened.

2.1. Concrete Composition Examples

Next, detailed composition examples of the components of the oscillation drive circuit 300 will be described.

Figure 10:
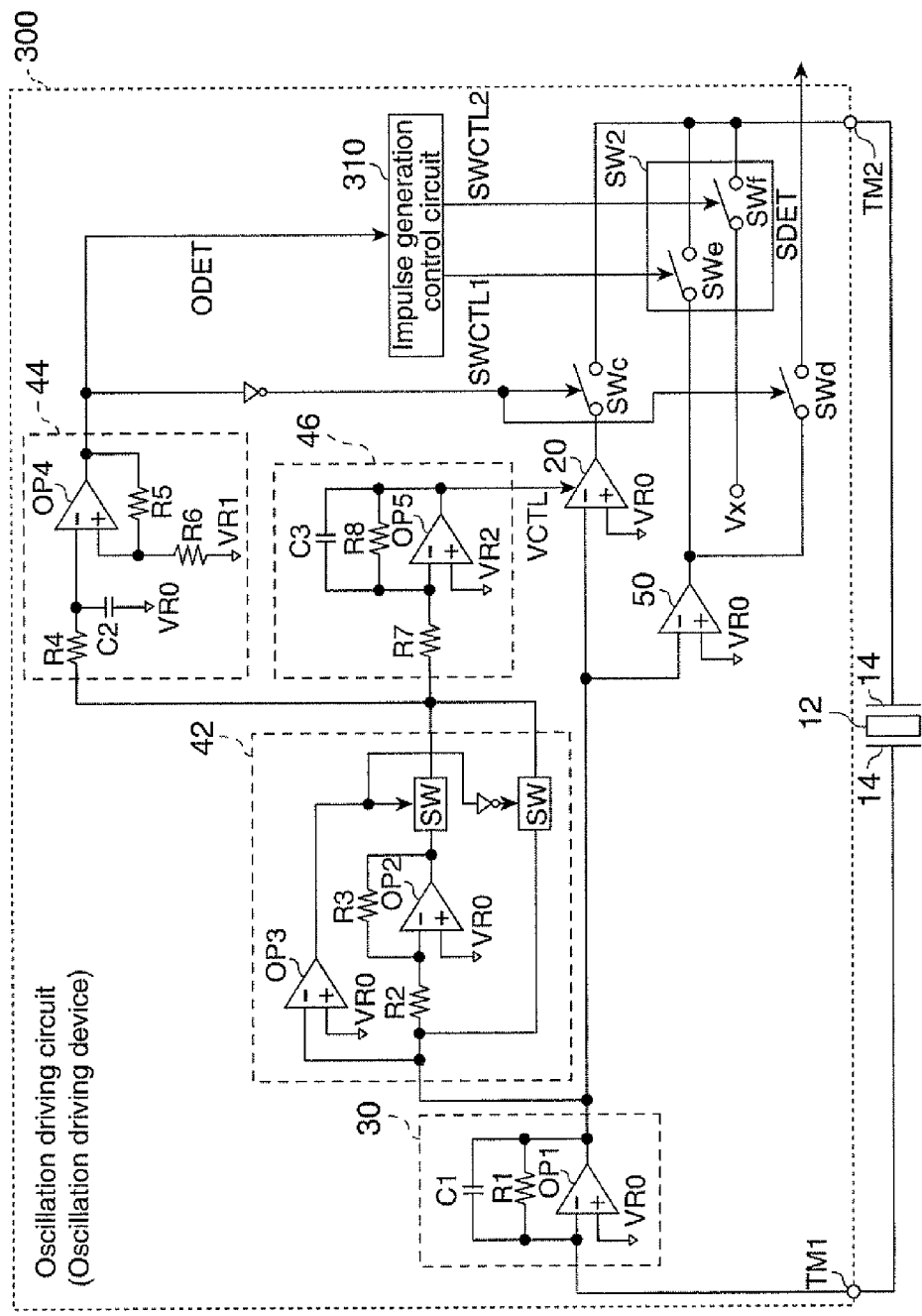
FIG. 10 is a circuit diagram of a composition example of the oscillation drive circuit shown in FIG. 8.

FIG. 10 is a circuit diagram of a composition example of the oscillation drive circuit 300 shown in FIG. 8. Components shown in FIG. 10 that are the same as those of FIG. 3 or FIG. 8 will be appended with the same reference numbers, and their description may be omitted if appropriate.

The oscillation drive circuit 300 includes a GCA 20, a comparator 50, a current-voltage converter 30, a full-wave rectifier 42, an oscillation detector 44, an integrator 46, a second switch circuit SW2, and an impulse generation control circuit 310. The compositions of the GCA 20, the comparator 50, the current-voltage converter 30, the full-wave rectifier 42, the oscillation detector 44 and the integrator 46 are substantially the same as those of Embodiment 1, and therefore their description are omitted. Also, the second switch circuit SW2 is substantially the same as that of the first switch circuit SW1, but switching control signals for controlling are different from those for the first switch circuit SW1.

2.1.1. Composition Example of Comparator

When the oscillation amplitude in the oscillation loop is controlled like Embodiment 2, the current that flows through the vibrator 12 changes. However, if the operation of the AGC circuit 40 is set in a disabled state in order to reduce the power consumption, the current that flows through the vibrator 12 may become excessive (for example, the current may exceed a predetermined threshold value), which may result in destruction of the vibrator 12. Accordingly, in Embodiment 2, the comparator may preferably be equipped with a current limiting function. The current limiting function may be a limiter function to control the current flowing through the vibrator 12 not to exceed a given value.

For this reason, the comparator 50 is supplied with a power supply voltage VDD as the high potential side power supply and an analog power supply voltage AGND as the lower potential side power supply. In this instance, the current limiter function of the comparator 50 is a function to control the current in the current path to at least one of the high potential side power supply and the lower potential side power supply.

Figure 11:
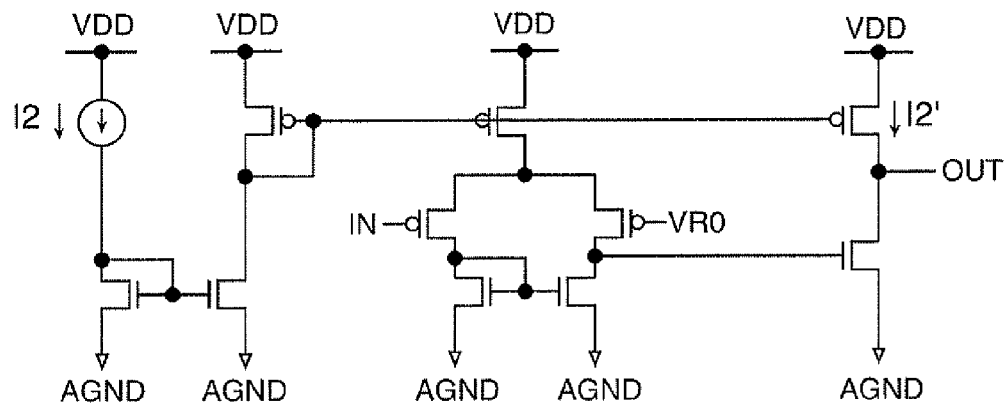
FIG. 11 is a circuit diagram of a composition example of a comparator shown in FIG. 8.

FIG. 11 is a circuit diagram of the composition example of the comparator 50 shown in FIG. 8.

In FIG. 11, a current I2 generated by a current source is supplied as an operating current of the P-type differential amplifier through two current-mirror circuits, and also supplied as a drain current I2' of the P-type output driver transistor. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied as a gate voltage of the N-type output driver transistor.

The P-type output driver transistor and the N-type output driver transistor are connected in series between the power supply voltage VDD and the analog power supply voltage AGND, and the output signal SDET that is the voltage of its connection node (i.e., the drain of the P-type output driver transistor) is outputted as a clock for synchronous wave detection as a reference signal for synchronous wave detection.

In accordance with the structure described above, with the comparator 50 of FIG. 11, the current drivability on the high potential side of the output voltage OUT is limited by the current I2'.

It is noted that the composition of the comparator 50 is not limited to the composition shown in FIG. 11.

Figure 12:
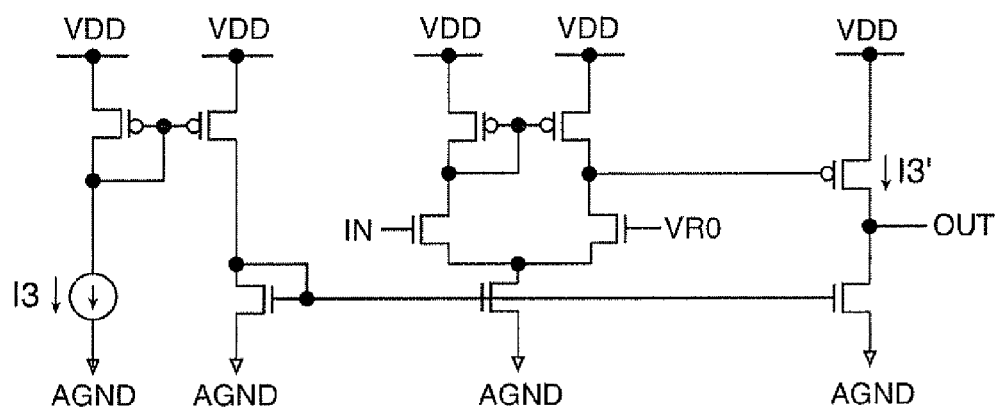
FIG. 12 is a circuit diagram of another example composition of a comparator shown in FIG. 8.

FIG. 12 is a circuit diagram of another composition example of the comparator 50 shown in FIG. 8.

In FIG. 12, a current I3 generated by a current source is supplied as an operating current of the N-type differential amplifier through two current-mirror circuits, and also supplied as a drain current I3' of the N-type output driver transistor. The voltage of the output node of the current-voltage converter 30 is supplied to the gate of one of a pair of N-type differential transistors of the N-type differential amplifier as an input signal IN. The reference voltage VR0 is supplied to the gate of the other N-type differential transistor of the N-type differential amplifier. The output voltage of the N-type differential amplifier is supplied as a gate voltage of the P-type output driver transistor.

The P-type output driver transistor and the N-type output driver transistor are connected in series between the power supply voltage VDD and the analog power supply voltage AGND, and the output signal SDET that is the voltage of its connection node (i.e., the drain of the N-type output driver transistor) is outputted as a clock for synchronous wave detection as a reference signal for synchronous wave detection.

In accordance with the structure described above, with the comparator 50 of FIG. 12, the current drivability on the high potential side of the output voltage OUT is limited by the current I3'.

In FIG. 11 and FIG. 12, the current in a current path to one of the high potential side power supply and the low potential side power supply is limited. However, the current in current paths to both of the high potential side power supply and the low potential side power supply may be limited.

Figure 13:
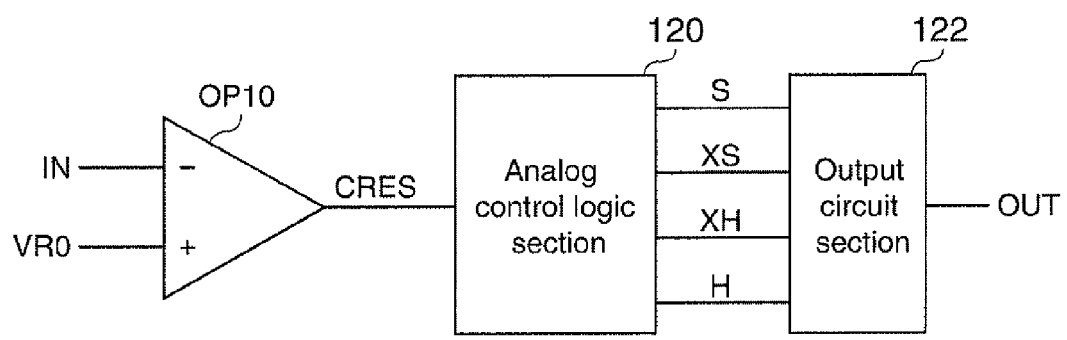
FIG. 13 is a circuit diagram of still another example composition of a comparator shown in FIG. 8.

FIG. 13 is a circuit diagram of still another composition example of the comparator 50 shown in FIG. 8.

In FIG. 13, the comparator 50 may include an operational amplifier OP10, an analog control logic section 120, and an output circuit section 122. The operational amplifier OP10 functions as a comparator that receives an output signal of the current-voltage converter 30, compares the same with the reference voltage VR0, and outputs a comparison result signal ORES. The analog control logic section 120 generates control signals S, XS, XH, and H which control the output circuit section 122 based on the comparison result signal ORES generated by the operational amplifier OP10. The output circuit section 122 generates the output signal while limiting the current supplied from the high potential side power supply or the current supplied to the low potential side power supply based on the control signals S, XS, XH, and H from the analog control logic section 120.

Figure 14A:
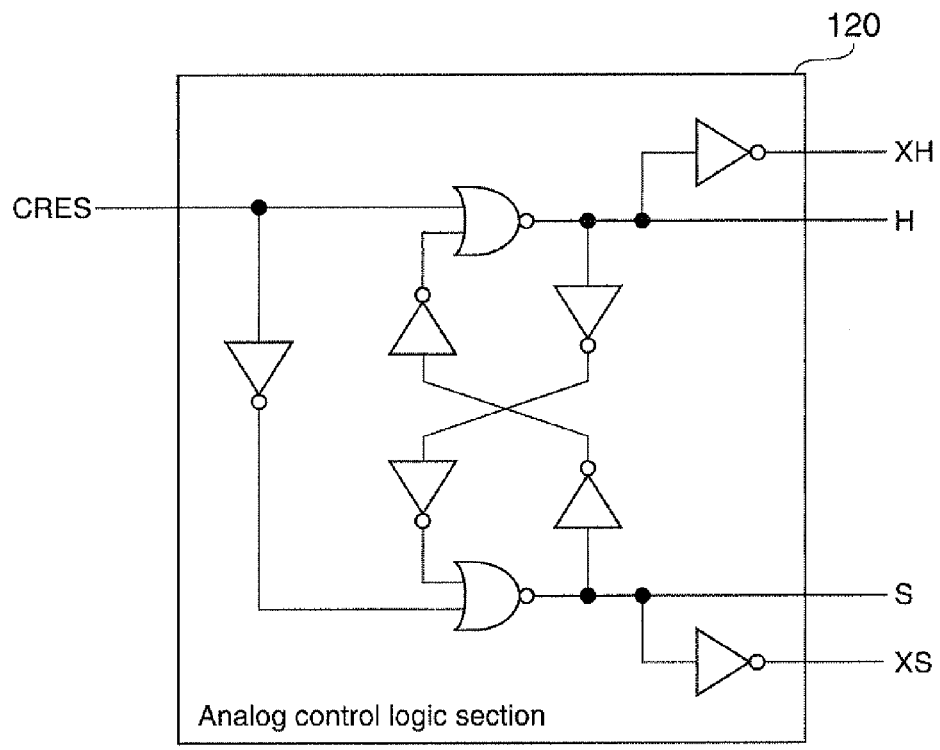
FIG. 14A is a circuit diagram of a composition example of an analog control logic section of FIG. 13.
Figure 14B:
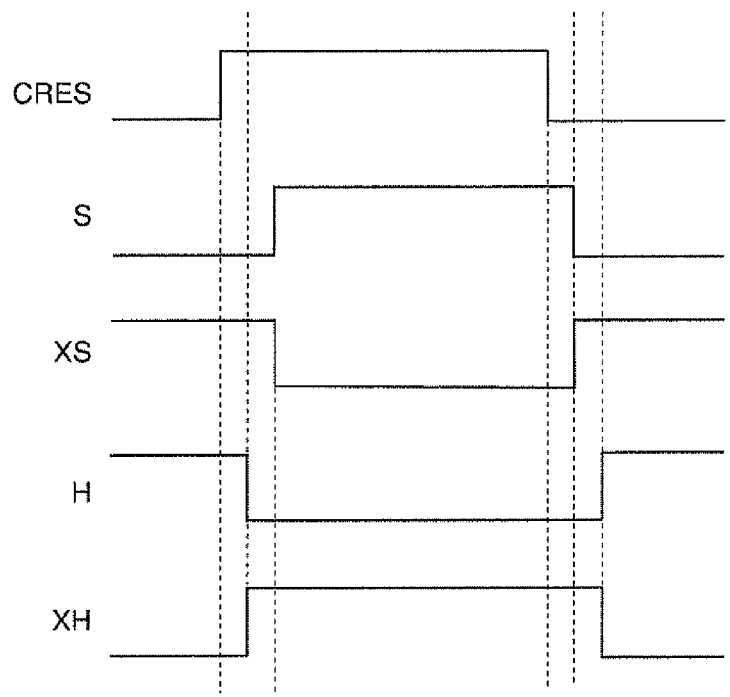

FIGS. 14A and 14B show diagrams for describing operations of the analog control logic section 120. FIG. 14A is a circuit diagram showing a composition example of the analog control logic section 120 shown in FIG. 7. FIG. 14B is a timing diagram showing an operation example of the analog control logic section 120 shown in FIG. 14A.

The analog control logic section 120 generates control signals S and H based on the comparison result signal ORES in a manner not to have identical change timings. The control signal XS is an inversion signal of the control signal S. The control signal XH is an inversion signal of the control signal H. In FIG. 14A, the comparison result signal ORES and its inversion signal are inputted to two-input/one-output NOR circuits, respectively. The other input signal of the first NOR circuit is a signal generated by delaying the signal output from the second NOR circuit, and the other input signal of the second NOR circuit is a signal generated by delaying the signal output from the first NOR circuit. According to this configuration, the control signal H rises based on the falling of the control signal 5, and the control signal S rises based on the falling of the control signal H.

Therefore, the control signals S and H are generated in a manner that their H-level periods do not overlap. Likewise, the control signals XS and XH are generated in a manner that their L-level periods do not overlap.

Figure 15:
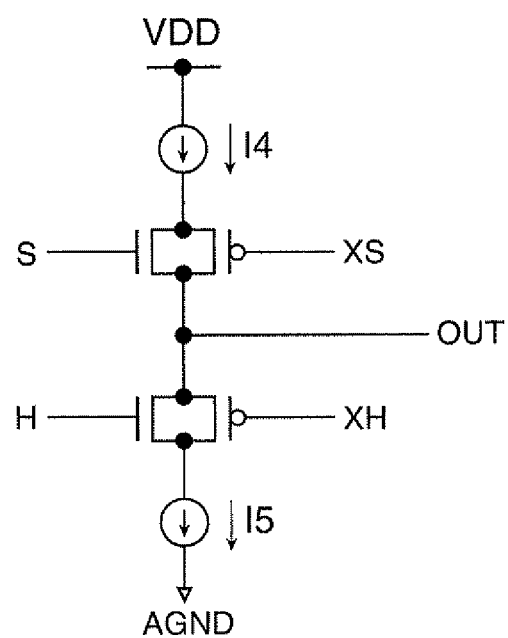
FIG. 15 is a diagram of a composition example of an output circuit section shown in FIG. 13.

FIG. 15 shows a configuration example of the output circuit section 122 shown in FIG. 13.

The output circuit section 122 includes first and second transfer gates, a first current source having one end to which the power supply voltage VDD is supplied and the other end that is connected to the first transfer gate, and a second current source having one end connected to the second transfer gate and the other end to which the analog power supply voltage AGND is supplied. The first current source generates a current I4. The second current source generates a current I5. The first and second transfer gates are connected in series, and the voltage OUT of their connection node is outputted as the output signal SDET of the comparator 50.

The control signals XS and S are respectively supplied to the gates of a P-type transistor and an N-type transistor forming the transfer gate connected with the first current source. The control signals XH and H are respectively supplied to the gates of a P-type transistor and an N-type transistor forming the transfer gate connected with the second current source.

According to this composition, the first and second transfer gates are controlled in a manner not to turn ON at the same time. The second transfer gate is turned OFF when the first transfer gate is turned ON, whereby the output voltage OUT changes in a state in which the current is limited by the current I4 of the first current source. Similarly, the first transfer gate is turned OFF when the second transfer gate is turned ON, whereby the output voltage OUT changes in a state in which the current is limited by the current I5 of the second current source.

Furthermore, it is preferable that the polarity (inversion and non-inversion) of the operational amplifier forming the GCA 20 be the same as the polarity of the operational amplifier forming the comparator 50. This makes it unnecessary to provide a circuit which reverses polarity, even if the oscillation loop is switched using the switch element SWc and the second switch element SW2, whereby an increase in circuit scale can be suppressed. Likewise, in Embodiment 1, the polarity of the operational amplifier forming the GCA 20 may be made the same as the polarity of the operational amplifier forming the comparator 50.

2.1.2 Composition Example of Impulse Generation Control Circuit

Figure 16:
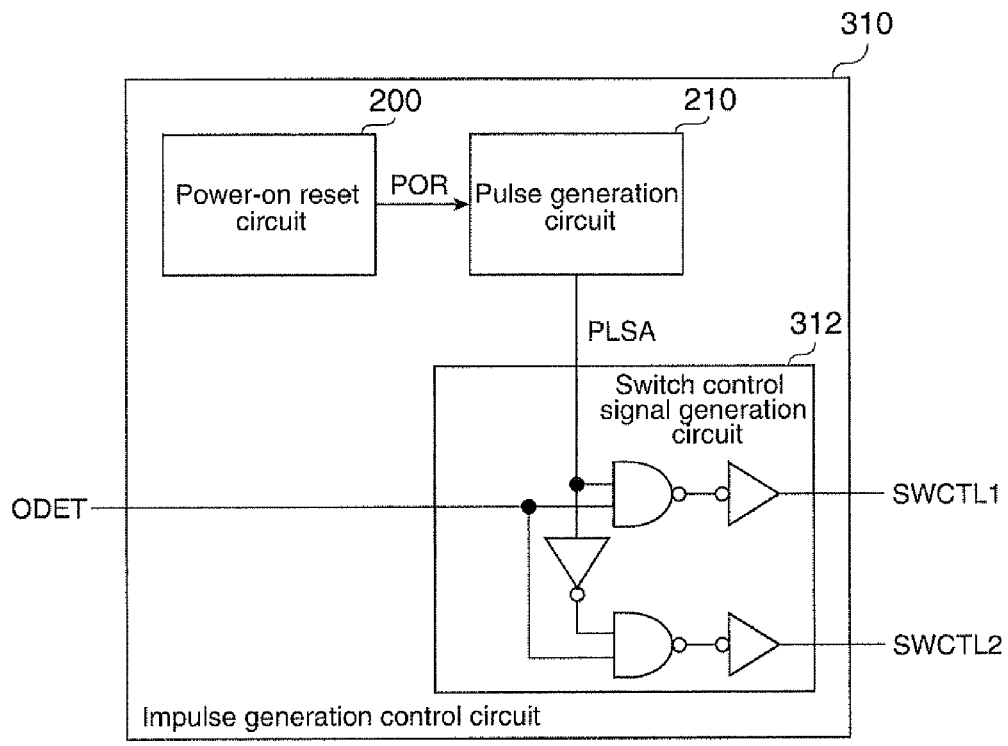
FIG. 16 is a circuit diagram of a composition example of an impulse generation control circuit shown in FIG. 8.

FIG. 16 is a block diagram showing a composition example of the impulse generation control circuit 310 shown in FIG. 8. Components in FIG. 16 that are the same as those shown in FIG. 5 will be appended with the same reference numbers, and their description may be omitted if appropriate.

The impulse generation control circuit 310 includes a power-on reset circuit 400, a pulse generation circuit 210, and a switch control signal generation circuit 312. The impulse generation control circuit 310 receives the detection signal ODET from the oscillation detector 44, and outputs switching control signals SWCTL1 and SWCTL2 that are output-controlled by the detection signal ODET.

The impulse generation control circuit 310 is different from the impulse generation control circuit 48 in that the switch control signal generation circuit 312 is provided in place of the switch control signal generation circuit 220. The detection signal ODET and the pulse signal PLSA from the pulse generation circuit 44 are inputted to the switch control signal generation circuit 312. The switch control signal generation circuit 312 generates switching control signal SWCTL1 and SWCTL2 each having one or more pulses in a specific period based on the detection signal ODET and the pulse signal PLSA.

Figure 17:
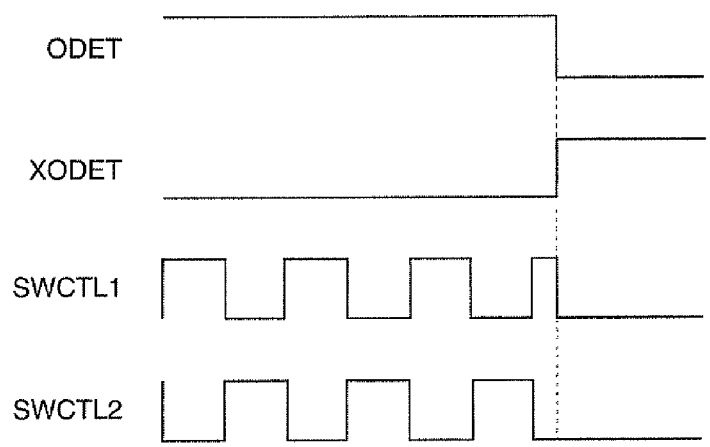
FIG. 17 is a timing chart of an example operation of a switch control signal generation circuit shown in FIG. 16.

FIG. 17 is a timing chart of an operation example of the switch control signal generation circuit 312 shown in FIG. 16. FIG. 17 schematically shows changes with time in the detection signal ODET that changes from a state in which oscillation in the oscillation loop is not detected by, for example, the oscillation detector 44 to a state in which oscillation is detected, its logical inverted signal XODET, and the switching control signals SWCTL1 and SWCTL2.

When oscillation is not detected by the oscillation detector 44, the detection signal ODET is, for example, at H level. Accordingly, the logical inverted signal XODET of the detection signal ODET is at L level. At this moment, the switch control signal generation circuit 312 outputs the pulse signal PLSA from the pulse generation circuit 210 as the switching control signal SWCTL1, and the logical inverted signal of the pulse signal PLSA as the switching control signal SWCLT2. Therefore, the switch elements SWc and SWd are set in a non-conductive state, and the energy is injected into the vibrator 12 while the second switch circuit SW2 alternately switches between the voltage corresponding to H level or L level of the output of the comparator 50 and the set voltage Vx.

When oscillation is detected by the oscillation detector 44, the detection signal ODET becomes to be, for example, at L level. Accordingly, the logical inverted signal XODET of the detection signal ODET becomes to be at H level. At this moment, the switch control signal generation circuit 312 sets the switching control signals SWCLT1 and SWCLT2 both at L level. Therefore, the switch elements SWc and SWd are set in a conductive state, and the switch elements SWe and SWf in the second switch circuit SW2 are set to a non-conductive state.

According to the above configuration, the impulse generation control circuit 310 can also output the switch control signals SWCTL1 and SWCTL2 (signal at a given frequency) each having one or more pulses in a period from the falling edge (change timing) of the power-on reset signal POR as a reference to the falling edge (change timing) of the detection signal ODET which indicates that the signal in the oscillation loop has exceeded a specific threshold value level.

It is noted that the impulse generation control circuit 310 is not limited to the composition shown in FIG. 16. For example, the clock number of the output of the oscillation circuit may be counted based on the change timing of the power-on reset signal POR, and the output of the oscillation circuit may be outputted as switching signals SWCTL1 and SWCTL2 during a period until a predetermined count value is reached. In this case, the finish timing of the specific period in which the impulse generation control circuit 310 outputs the switch control signals SWCTL1 and SWCTL2 in a pulsed manner may be the timing at which it has been detected that the predetermined count number is counted based on the start timing of the predetermined period.

3. Physical Quantity Measurement Device

The oscillation drive circuit in accordance with Embodiment 1 or Embodiment 2 may be applied to, for example, a vibration type gyro-sensor that is a physical quantity measurement device as follows.

Figure 18:
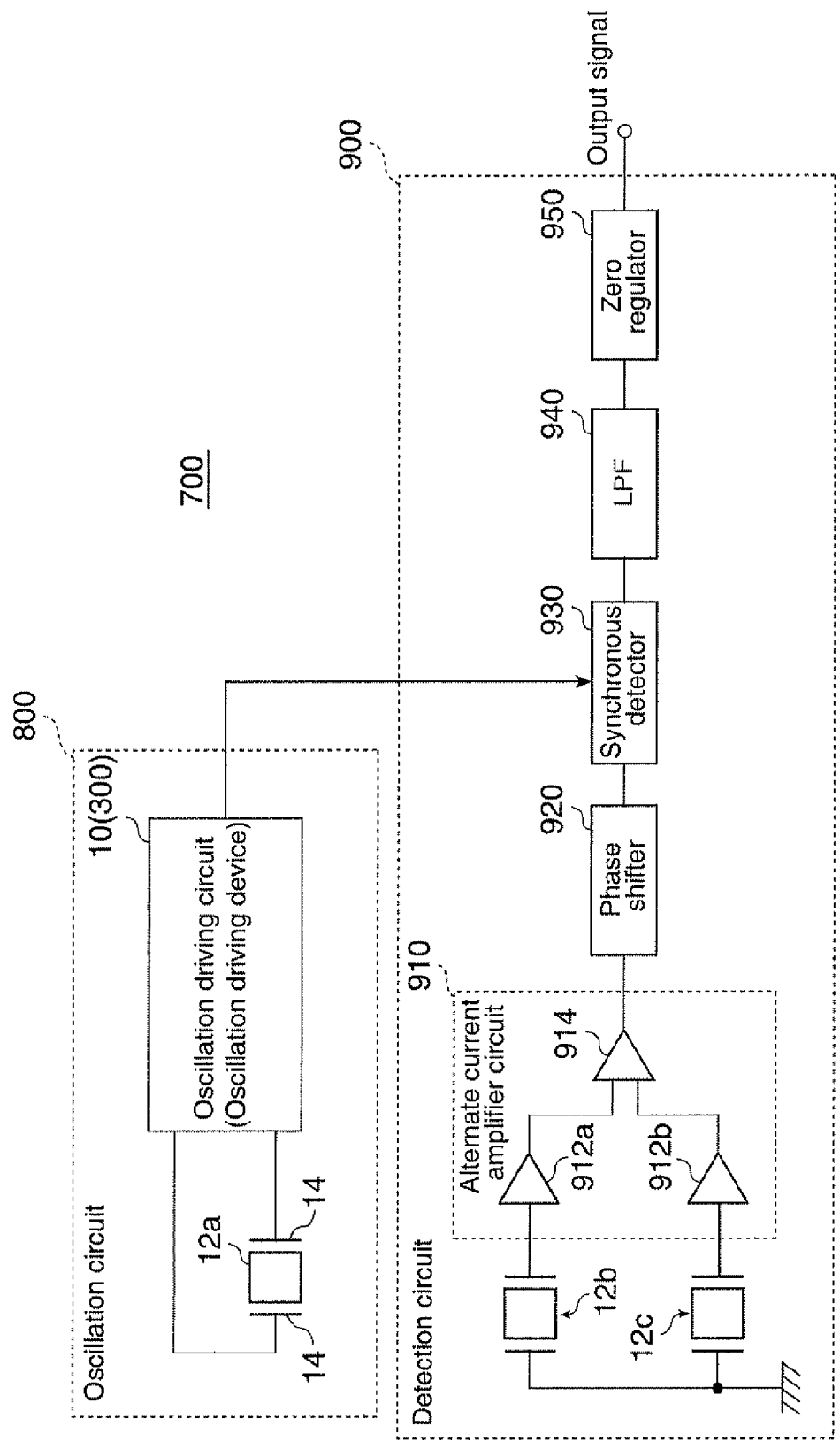
FIG. 18 is a block diagram of a composition example of a vibration type gyro-sensor to which the oscillation drive circuit according to Embodiment 1 or Embodiment 2.

FIG. 18 is a block diagram showing a configuration example of a vibration type gyro-sensor to which the oscillation driver circuit according to Embodiment 1 or Embodiment 2 is applied. Components in FIG. 18 that are substantially the same as those shown in FIG. 1 or FIG. 8 will be appended with the same reference numbers and their description may be omitted if appropriate.

A vibration type gyro-sensor (a physical quantity measurement device in a broad sense) 700 includes an oscillation circuit 800 and a detection circuit (a detection device in a broad sense) 900. The oscillation circuit 800 includes the vibrator 12 and the oscillation drive circuit 10 or the oscillation drive circuit 300. The oscillation drive circuit 10 or the oscillation drive circuit 300 is provided for exciting a driving vibration section 12a on the vibrator 12.

At the time of oscillation startup, the output from the comparator 50 is inputted to the oscillation drive circuit 300 as noise. The noise is subjected to frequency selection while passing through a driving vibration section 12a of the vibrator 12. The signal which has passed through the driving vibration section 12a is partially removed, is inputted to the full-wave rectifier 42, and is converted into an amplitude. The signal with this amplitude is inputted to the oscillation detector 44. The impulse generation control circuit 48 or the impulse generation control circuit 310 which has received the detection signal ODET from the oscillation detector 44 generates the switch control signal. The amplitude of the signal subjected to frequency selection while passing through the driving vibration section 12a of the vibrator 12 is small during oscillation startup such that the impulse generation control circuit 48 or the impulse generation control circuit 310 outputs the switch control signal as described above.

Then, immediately after oscillation startup, as the amplitude of the signal subjected to frequency selection while passing through the vibrator 12a increases, the signal subjected to frequency selection while passing through the vibrator 12a becomes to be amplitude-controlled by the GCA 20. Then, when most of the noise is cut off by the driving vibration section 12a and the output from the full-wave rectifier 42 is relatively small, the gain of the GCA 20 is increased so that the loop gain of the oscillation loop becomes unity. Since the output from the full-wave rectifier 42 increases with the passage of time, the gain of the GCA 20 is reduced so that the loop gain becomes unity.

When the oscillation state of the driving signal has been stabilized, detection of signals from driving detection sections 12b and 12c of the vibrator 12 starts. Specifically, the detection signals (alternating-current) from the driving detection sections 12b and 12c of the vibrator are amplified using alternating-current amplifiers 912A and 912B of an alternating-current amplifier circuit 910, and the outputs from the amplifiers 912A and 912B are summed using an adder 914.

The output from the adder 914 is caused to pass through a phase shifter 920 to obtain a phase-shifted signal. The phase of the phase-shifted signal differs from the phase of the synchronous detection clock signal which is the output from the comparator 50 of the oscillation driver circuit 10 or the oscillation driver circuit 300 by a specific angle, for example, 90°. The phase-shifted signal and the synchronous detection clock signal are input to a synchronous detector 930 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 900, a highly accurate phase adjustment can be achieved while preventing an increase in circuit scale.

The detected output signal is inputted to a low-pass filter 940, smoothed, and inputted to a zero regulator 950. The output from the zero regulator 950 is retrieved as an output signal corresponding to the physical quantity (e.g. angular velocity) to be measured.

The vibration type gyro-sensor 700 shown in FIG. 18 is preferably mounted in electronic instruments, such as, for example, a video camera, a digital camera, a car navigation system, an aircraft, and a robot.

The oscillation drive device, the physical quantity measurement device and the electronic devices in accordance with the embodiments of the invention have been described. However, the invention is not limited to the embodiments described above, and many modifications in the range without departing from the subject matter can be made. For example, the following modifications can be made.

(1) The invention is not limited to the vibrator 12 described in Embodiment 1 or Embodiment 2. As examples of the material for the vibrator 12, constant modulus alloys such as elinvar and ferroelectric single crystals (piezoelectric single crystals) can be enumerated. As examples of such single crystals, a rock crystal, lithium niobate, lithium tantalate, a lithium niobate-lithium tantalate solid solution, lithium borate, and langasite can be enumerated. It is preferable that the vibrator 12 be hermetically sealed in a package. It is preferable that the package be filled with dry nitrogen or be under vacuum.

(2) The physical quantity measured according to the invention is not limited to the angular velocity illustrated in Embodiment 1 or Embodiment 2. The invention aims at any physical quantity that can be detected from a change in vibration state of a vibrator using a detection circuit. For example, in the case where a vibrator is excited to produce a driving vibration, and the vibration state of the vibrator has changed due to the effect of a physical quantity applied to the vibrator which is producing the driving vibration, the invention is applicable to measure such physical quantity. As the physical quantity, acceleration, angular acceleration, and the like are particularly preferred in addition to the angular velocity applied to the vibrator. As the detection device, an inertial sensor or the like is preferred.

What is claimed is:

1. An oscillation drive device that forms an oscillation loop with a vibrator for exciting a driving vibration on the vibrator, the oscillation drive device comprising:

a comparator that excites a driving vibration on the vibrator based on a signal in the oscillation loop with a given voltage as a reference;

an oscillation detector that detects oscillation in the oscillation loop;

a signal generation circuit that generates a switching control signal based on an oscillation result given by the oscillation detector; and a switch circuit inserted between the vibrator in the oscillation loop and an output of the comparator, wherein, during an oscillation startup stage in which oscillation in the oscillation loop is not detected by the oscillation detector, the switch circuit alternately switches, based on the switching control signal, between a period in which the output of the comparator and the vibrator are electrically connected and a period in which a predetermined set voltage is supplied to the vibrator.

2. An oscillation drive device according to claim 1, wherein the switch circuit electrically connects the output of the comparator with the vibrator based on the switching control signal in a stationary oscillation state in which oscillation in the oscillation loop is detected by the oscillation detector.

3. An oscillation drive device according to claim 1, wherein the set voltage is a voltage between a high potential side voltage of the comparator and a low potential side voltage of the comparator.

4. An oscillation drive device that forms an oscillation loop with a vibrator for exciting a driving vibration in the vibrator, the oscillation drive device comprising:
- a comparator that excites a driving vibration on the vibrator based on a signal in the oscillation loop with a given voltage as a reference;
- a synchronous wave detection comparator that generates a reference signal for synchronous detection based on a signal in the oscillation loop;
- an oscillation detector that detects oscillation in the oscillation loop;
- a signal generation circuit that generates a switching control signal based on an oscillation result given by the oscillation detector;
- a first switch circuit inserted between the vibrator in the oscillation loop and an output of the comparator; and
- a second switch circuit inserted between an output of the synchronous wave detection comparator and the vibrator,
wherein, during an oscillation startup stage in which oscillation in the oscillation loop is not detected by the oscillation detector, the first switch circuit electrically shuts off the output of the comparator from the vibrator based on the switching control signal, and the second switch alternately switches based on the switching control signal between a period in which an output of the synchronous wave detection comparator and the vibrator are electrically connected and a period in which a predetermined set voltage is supplied to the vibrator.

5. An oscillation drive device according to claim 4, wherein the signal generation circuit generates the switching control signal having a given frequency only during a predetermined period with the start timing of power-on reset of the oscillation drive device as a reference.

6. An oscillation drive device according to claim 4, wherein an end timing of the predetermined period is a timing at which the signal in the oscillation loop exceeds a predetermined threshold level is detected, or a predetermined count number is counted with the start timing of the predetermined period as a reference.

7. An oscillation drive device according to claim 4 wherein the signal generation circuit includes a power-on reset circuit that generates a power-on reset signal, and a pulse generation circuit that generates a pulse or a plurality of pulses based on the power-on reset signal in a predetermined period, wherein the pulse generation circuit includes a plurality of delay units wherein each of the delay units generates a pulse based on an input signal, and each of the delay units outputs a calculation result of logical addition of the generated pulse, wherein the signal with the given frequency is outputted during a period starting with a timing of a change in the power-on reset signal as a reference until a timing of a change in the detection result signal indicating that the signal in the oscillation loop exceeds the predetermined threshold level.

8. A physical quantity measurement device that measures a physical quantity corresponding to a detection signal that is outputted from a vibrator, based on a driving vibration excited by the vibrator and a physical quantity to be measured, the physical quantity measurement device comprising:
- a vibrator;
- the oscillation drive device recited in claim 4 for exciting a driving vibration on the vibrator; and
- a detection device that detects an output signal corresponding to the physical quantity based on the detection signal,
wherein the detection device includes a synchronous wave detector that synchronously detects the detection signal based on an output of a synchronous wave detection comparator that generates a reference signal for synchronous wave detection based on a signal in the oscillation loop.

9. A physical quantity measurement device according to claim 8, wherein the detection device includes a phase shifter for adjusting phases of an output of the synchronous wave detection comparator and the detection signal.

10. An electronic apparatus comprising the physical quantity measurement device recited in claim 8.

11. An oscillation drive device according to claim 4, wherein the comparator is a gain control amplifier that excites the oscillation amplitude in the oscillation loop to the driving vibration of the vibrator.

12. An oscillation drive device according to claim 4, wherein, in the stationary oscillation state in which oscillation in the oscillation loop is detected by the oscillation detector, an output of the synchronous wave detection comparator is outputted as the reference signal based on the switching control signal, and the first switch circuit electrically connects the output of the comparator with the vibrator based on the switching control signal.

13. An oscillation drive device according to claim 4, wherein the polarity of the output of the comparator is the same as the polarity of the output of the synchronous wave detection comparator.

14. An oscillation drive device according to claim 4, wherein the set voltage is a voltage between a high potential side voltage of the synchronous wave detection comparator and a low potential side voltage of the synchronous wave detection comparator.

* * * * *